(12) United States Patent
Hwang et al.

(10) Patent No.: US 11,037,517 B2
(45) Date of Patent: Jun. 15, 2021

(54) GATE DRIVING CIRCUIT HAVING STABILIZATION

(71) Applicant: SAMSUNG DISPLAY CO., LTD., Yongin-si (KR)

(72) Inventors: Junghwan Hwang, Cheonan-si (KR); Chanwook Shim, Daejeon (KR); Youngchul Jo, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/666,054

(22) Filed: Oct. 28, 2019

(65) Prior Publication Data
US 2020/0066224 A1 Feb. 27, 2020

Related U.S. Application Data

(63) Continuation of application No. 15/162,499, filed on May 23, 2016, now Pat. No. 10,460,691.

(30) Foreign Application Priority Data

Sep. 22, 2015 (KR) .................. 10-2015-0134053

(51) Int. Cl.
*G09G 3/36* (2006.01)

(52) U.S. Cl.
CPC ......... *G09G 3/3696* (2013.01); *G09G 3/3677* (2013.01); *G09G 2310/0289* (2013.01); *G09G 2310/08* (2013.01); *G09G 2330/04* (2013.01)

(58) Field of Classification Search
None
See application file for complete search history.

(56) References Cited

U.S. PATENT DOCUMENTS 6,980,186 B2 12/2005 Nakano et al.
2003/0107543 A1 6/2003 Nakano et al.
(Continued)

FOREIGN PATENT DOCUMENTS

JP 2014-197691 A 10/2014
KR 10-2006-0076489 A 7/2006
(Continued)

OTHER PUBLICATIONS

Chiang, Chun-Sung et al., "Electrical Instability of Hydrogenated Amorphous Silicon Thin-Film Transistors for Active-Matrix Liquid-Crystal Displays," Japanese Journal of Applied Physics, 1998, pp. 4704-4710, vol. 37, Pt. 1, No. 9A, Publication Board, Japanese Journal of Applied Physics, Japan.

*Primary Examiner* — Amr A Awad
*Assistant Examiner* — Donna V Lui
(74) *Attorney, Agent, or Firm* — Lewis Roca Rothgerber Christie LLP

(57) ABSTRACT

A display device to display an image during frame intervals, and to display a blank image during a blank interval defined between the frame intervals, includes: a gate driving circuit including a plurality of stages, an ith stage (i is an integer greater than or equal to 2) from among the plurality of stages including a clock terminal to receive a clock signal, wherein the clock signal swings between a first clock voltage and a second clock voltage smaller than the first clock voltage during a normal interval corresponding to each of the frame intervals, and the clock signal is changed to a voltage lower than the second clock voltage during a stabilization interval corresponding to the blank interval.

16 Claims, 18 Drawing Sheets

(56) References Cited

U.S. PATENT DOCUMENTS

| | | |
|---|---|---|
| 2010/0207928 A1 | 8/2010 | Lee et al. |
| 2013/0141318 A1* | 6/2013 | Kim .................... H03K 17/693 |
| | | 345/87 |
| 2013/0241814 A1 | 9/2013 | Hirabayashi et al. |
| 2014/0078128 A1 | 3/2014 | Nam et al. |
| 2016/0155409 A1 | 6/2016 | Jeoung et al. |

FOREIGN PATENT DOCUMENTS

| | | |
|---|---|---|
| KR | 10-2010-0006063 A | 1/2010 |
| KR | 10-2010-0045922 A | 5/2010 |
| KR | 10-2016-0130076 | 11/2016 |

* cited by examiner

GATE DRIVING CIRCUIT HAVING STABILIZATION

CROSS-REFERENCE TO RELATED APPLICATION

This application is a continuation of U.S. application Ser. No. 15/162,499, filed on May 23, 2016, which claims priority to and the benefit of Korean Patent Application No. 10-2015-0134053, under 35 U.S.C. § 119, filed on Sep. 22, 2015 in the Korean Intellectual Property Office (KIPO), the contents of both of which in their entirety are herein incorporated by reference.

BACKGROUND

1. Field

One or more aspects of example embodiments of the present disclosure relate to a display device, and more particularly, to a display device for compensating for the deterioration of transistors of a gate driving circuit.

2. Description of the Related Art

A display device includes a plurality of gate lines, a plurality of data lines, and a plurality of pixels connected to the plurality of gate lines and the plurality of data lines. The display device includes a gate driving circuit for sequentially providing gate signals to the plurality of gate lines, and a data driving circuit for outputting data signals to the plurality of data lines.

The gate driving circuit includes a shift register including a plurality of stages connected in cascade. Each of the plurality of stages includes a plurality of transistors that are connected (e.g., operatively connected) to each other to output a gate voltage to a corresponding gate line.

The plurality of transistors included in each of the plurality of stages may be deteriorated by an applied voltage (e.g., a continuously applied voltage).

The above information disclosed in this Background section is for enhancement of understanding of the background of the present disclosure, and therefore, it may contain information that does not constitute prior art.

SUMMARY

One or more aspects of example embodiments of the present disclosure are directed toward a display device for compensating for the deterioration of transistors caused by a voltage applied to a gate driving circuit.

According to an example embodiment of the inventive concept, a display device configured to display an image during frame intervals, and to display a blank image during a blank interval defined between the frame intervals, includes: a gate driving circuit including a plurality of stages, an ith stage (i is an integer greater than or equal to 2) from among the plurality of stages including a clock terminal configured to receive a clock signal, wherein the clock signal swings between a first clock voltage and a second clock voltage smaller than the first clock voltage during a normal interval corresponding to each of the frame intervals, and the clock signal is changed to a voltage lower than the second clock voltage during a stabilization interval corresponding to the blank interval.

In an embodiment, the ith stage may include: a first output unit configured to be turned on/off according to a voltage of a Q-node and output a gate signal including a gate-on signal and a gate-off signal from the clock signal to a gate output terminal of the ith stage; a control unit configured to control the voltage of the Q-node; and a first pull-down unit configured to provide a first low signal to the gate output terminal after the gate-on signal is outputted from the first output unit.

In an embodiment, the display device of the ith stage further comprises a second output unit configured to be turned on/off according to a potential of the Q-node and output a carry signal including a carry-on signal and a carry-off signal from the clock signal to a carry output terminal of the ith stage.

In an embodiment, the ith stage may further include a second pull-down unit configured to provide a second low signal to the carry output terminal after a carry-on signal is outputted from the second output unit.

In an embodiment, a voltage of the second low signal may be smaller than a voltage of the first low signal.

In an embodiment, the second clock voltage may be equal to the voltage of the second low signal.

In an embodiment, the first clock voltage may be greater than or equal to about 15V and less than or equal to about 35V; the second clock voltage may be greater than or equal to about −12V and less than or equal to about −10V; the voltage of the first low signal may be greater than or equal to about −8V and less than or equal to about −6V; and the voltage of the second low signal may be greater than or equal to about −12V and less than or equal to about −10V.

In an embodiment, the clock signal may maintain a uniform DC voltage during the stabilization interval.

In an embodiment, the DC voltage may be greater than or equal to about −50V and less than or equal to about −15V.

In an embodiment, the clock signal may swing between the second clock voltage and a third clock voltage smaller than the second clock voltage during the stabilization interval.

In an embodiment, the third clock voltage may be greater than or equal to about −50V and less than or equal to about −15V.

In an embodiment, the clock signal may have a voltage that gradually increases during the stabilization interval.

In an embodiment, the clock signal may have a voltage that gradually decreases during the stabilization interval.

In an embodiment, the control unit may be configured to provide a second low signal to the Q-node after the gate-on signal is outputted from the ith stage; and a voltage of the second low signal may be smaller than a voltage of the first low signal.

In an embodiment, a voltage of the second low signal during the blank interval may be smaller than a voltage of the second low signal during the frame intervals.

In an embodiment, a voltage of the second low signal may be greater than or equal to about −12V and less than or equal to about −10V during the frame intervals; and a voltage of the second low signal may be greater than or equal to about −50V and less than or equal to about −15V during the blank interval.

In an embodiment, after the blank interval starts, the clock signal may swing at least once before the stabilization interval starts; and after the stabilization interval ends, the clock signal may swing at least once before the blank interval ends.

According to an example embodiment of the inventive concept, a display device including a frame interval for displaying an image, and a blank interval for displaying a blank image, includes: a gate driving circuit including a plurality of stages configured to output gate signals to gate lines, respectively, and connected in cascade, wherein an ith stage (i is an integer of 2 or more) from among the plurality of stages is configured to receive: a normal clock signal that swings between a first clock voltage and a second clock voltage smaller than the first clock voltage during the frame interval; and a stabilization signal having a voltage lower than the second clock voltage during a stabilization interval corresponding to the blank interval.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept, and together with the detailed description, explain aspects and features of example embodiments of the inventive concept. In the drawings.

DETAILED DESCRIPTION

Figure 1:
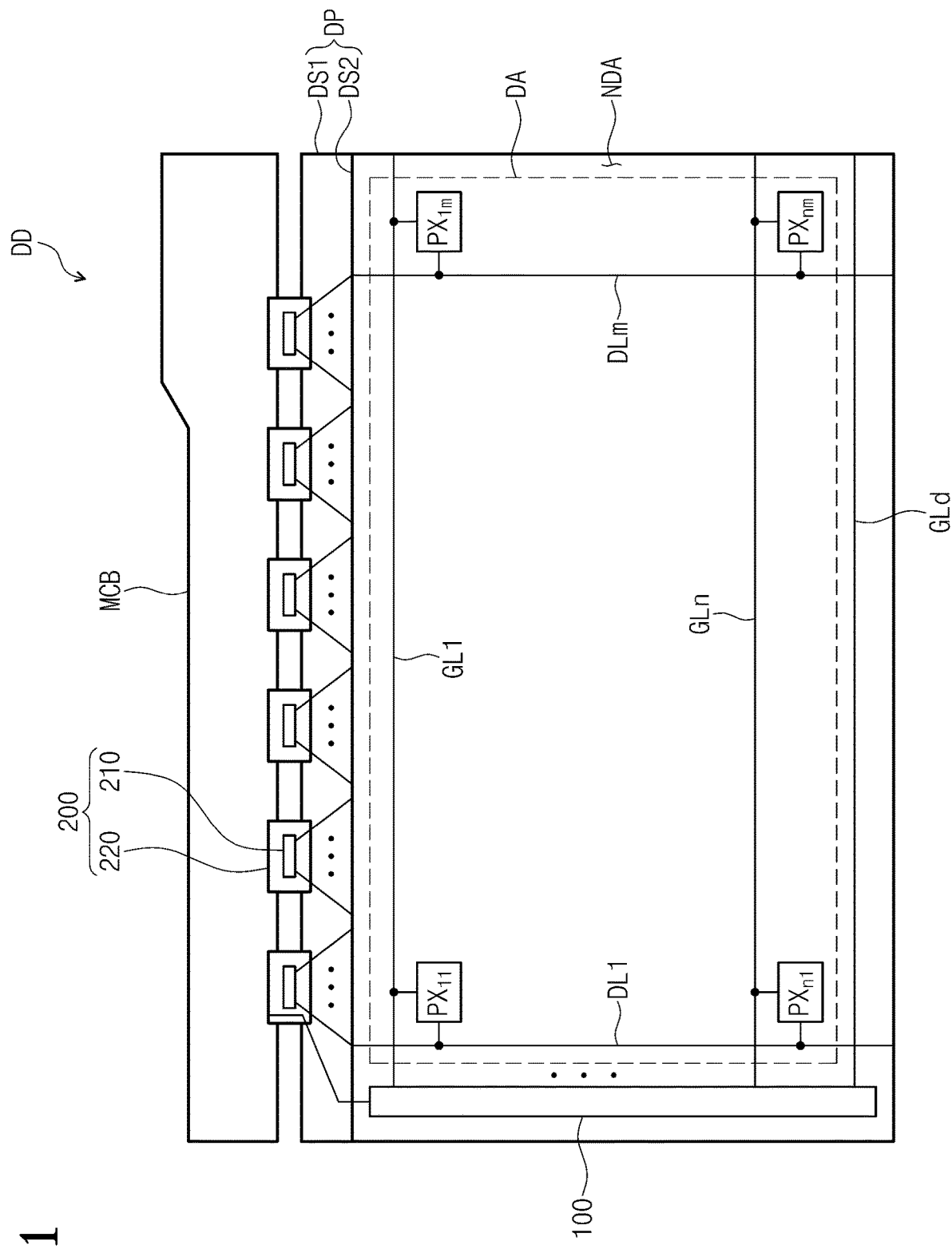
FIG. 1 is a plan view of a display device according to an embodiment of the inventive concept.

Hereinafter, example embodiments will be described in more detail with reference to the accompanying drawings. The present inventive concept, however, may be embodied in various different forms, and should not be construed as being limited to only the illustrated embodiments herein. Rather, these embodiments are provided as examples so that this disclosure will be thorough and complete, and will fully convey the aspects and features of the inventive concept to those skilled in the art. Accordingly, processes, elements, and techniques that are not necessary to those having ordinary skill in the art for a complete understanding of the aspects and features of the inventive concept may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the inventive concept.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the inventive concept refers to "one or more embodiments of the inventive concept." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
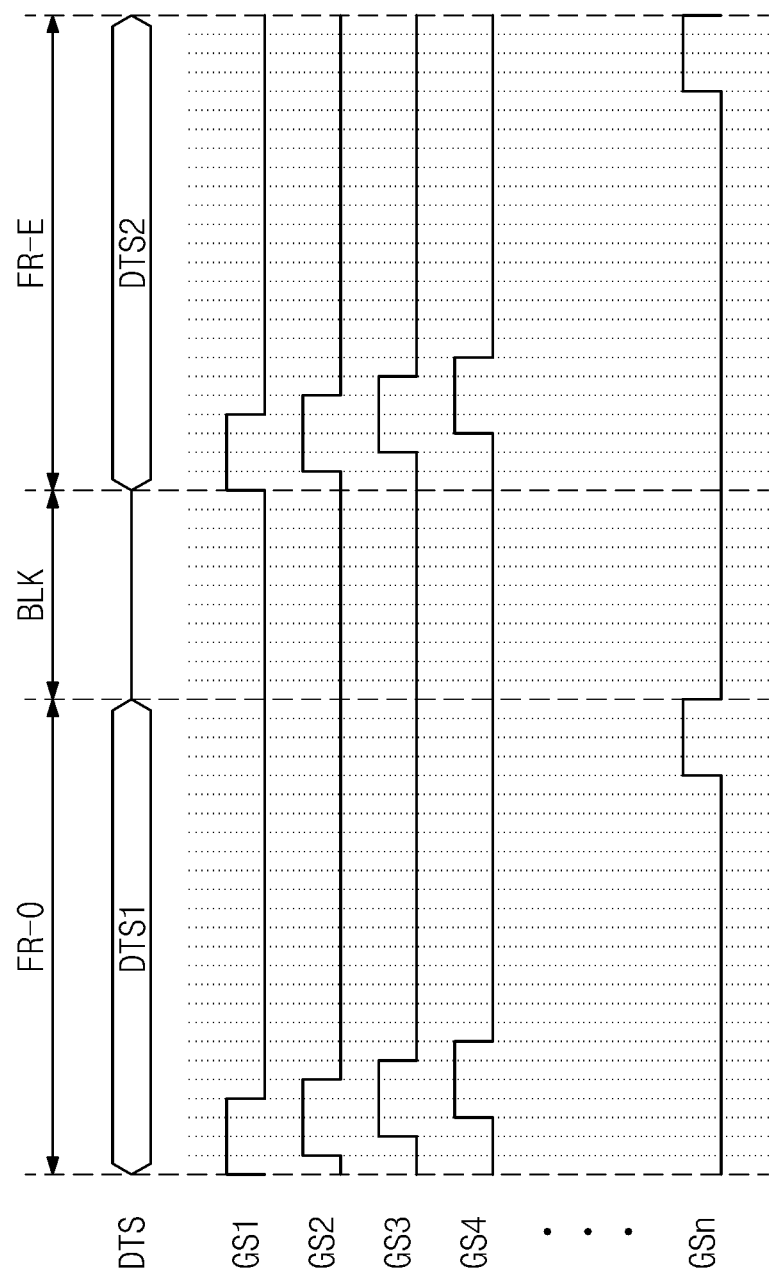
FIG. 2 is a timing diagram illustrating signals of a display device according to an embodiment of the inventive concept.

FIG. 1 is a block diagram illustrating a display device DD according to an embodiment of the inventive concept. FIG. 2 is a timing diagram illustrating signals of a display device DD according to an embodiment of the inventive concept.

As shown in FIG. 1, a display device according to an embodiment of the inventive concept includes a display panel DP, a gate driving circuit 100, a data driving circuit 200, and a main circuit substrate MCB.

The display panel DP is not limited to a specific kind of display panel and may include various display panels, such as a liquid crystal display panel, an organic light emitting display panel, an electrophoretic display panel, and/or an electrowetting display panel. In the present embodiment, the display panel DP is described as a liquid crystal display panel. Accordingly, a liquid crystal display device including the liquid crystal display panel may further include a polarizer and a backlight unit (e.g., a backlight or a backlight source).

The display panel DP includes a first substrate DS1, a second substrate DS2 spaced from the first substrate DS1, and a liquid crystal layer located (e.g., disposed) between the first substrate DS1 and the second substrate DS2. On a plane, the display panel DP includes a display area DA, where a plurality of pixels PX11 to PXnm are located, and a non display area NDA surrounding the display area DA.

The display panel DP includes a plurality of gate lines GL1 to GLn on the first substrate DS1, and a plurality of data lines DL1 to DLm crossing the plurality of gate lines GL1 to GLn. The plurality of gate lines GL1 to GLn are connected to the gate driving circuit 100. The plurality of data lines DL1 to DLm are connected to the data driving circuit 200. For convenience, only some of the plurality of gate lines GL1 to GLn and some of the plurality of data lines DL1 to DLm are illustrated in FIG. 1. Additionally, the display panel DP may further include a dummy gate line GLd at the non display area NDA of the first substrate DS1. The dummy gate line GLd may be formed in a plurality (e.g., may include a plurality of dummy gate lines).

For convenience, only some of the plurality of pixels PX11 to PXnm are illustrated in FIG. 1. The plurality of pixels PX11 to PXnm are respectively connected to corresponding gate lines from among the plurality of gate lines GL1 to GLn and corresponding data lines from among the plurality of data lines DL1 to DLm. However, the dummy gate line GLd may not be connected to the plurality of pixels PX11 to PXnm.

The plurality of pixels PX11 to PXnm may be divided into a plurality of groups according to a color. Each of the plurality of pixels PX11 to PXnm may display one of primary colors. The primary colors may include red, green, blue, and white. However, the inventive concept is not limited thereto, and thus, the primary colors may further include (or alternatively include) various colors, such as yellow, cyan, magenta, etc.

The gate driving circuit 100 and the data driving circuit 200 receive a control signal from a signal control unit (e.g., a signal controller, for example, a timing controller). The signal control unit may be mounted on the main circuit board MCB. The signal control unit receives image data and control signals from an external graphic control unit (e.g., an external graphic controller).

The gate driving circuit 100 generates gate signals GS1 to GSn based on a control signal received from the signal control unit during frame intervals FR-O and FR-E, and outputs the gate signals GS1 to GSn to the plurality of gate lines GL1 to GLn. The gate signals GS1 to GSn may be sequentially outputted.

The gate driving circuit 100 and the pixels PX11 to PXnm may be formed concurrently (e.g., simultaneously) through a thin film process. For example, the gate driving circuit 100 may be mounted in an Amorphous Silicon TFT Gate driver circuit (ASG) form or an Oxide Semiconductor TFT Gate driver circuit (OSG) form in the non display area NDA. The gate driving circuit 100 includes a plurality of driving transistors TRG.

FIG. 1 illustrates one gate driving circuit 100 connected to the left ends of the plurality of gate lines GL1 to GLn. However, the inventive concept is not limited thereto, for example, a display device may include two gate driving circuits. In this case, one of the two gate driving circuits may be connected to the left ends of the plurality of gate lines GL1 to GLn and the other one of the two gate driving circuits may be connected to right ends of the plurality of gate lines GL1 to GLn. Additionally, one of the two gate driving circuits may be connected to odd gate lines and the other one of the two gate driving circuits may be connected to even gate lines. Additionally, the gate driving circuit 100 may have a structure in which a plurality of phase gate driving circuits (e.g., see FIGS. 5B to 5E) overlap each other.

The data driving circuit 200 generates grayscale voltages according to image data provided from the signal control unit based on a control signal (hereinafter referred to as a data control signal) received from the signal control unit. The data driving circuit 200 outputs the grayscale voltages as a data signal DTS to the plurality of data lines DL1 to DLm.

The data signal DTS may include positive data voltages having a positive value for a common voltage and/or negative data voltages having a negative value. Some of the data voltages applied to the data lines DL1 to DLm may have a positive polarity and others may have a negative polarity. The polarity of the data signal DTS may be inverted according to the frame intervals FR-O and FR-E in order to prevent or reduce the deterioration of a liquid crystal. The data driving circuit 200 may generate data voltages inverted by each frame interval unit in response to an invert signal.

The data driving circuit 200 may include a driving chip 210 and a flexible circuit board 220 for mounting the driving chip 210. The data driving circuit 200 may include a plurality of driving chips 210 and a plurality of flexible circuit boards 220. The flexible circuit board 220 electrically connects a main circuit board (or the main circuit substrate) MCB with the first substrate DS1. The plurality of driving chips 210 provide corresponding data signals to corresponding data lines from among the plurality of data lines DL1 to DLm.

FIG. 1 illustrates a Tape Carrier Package (TCP) type (or kind) data driving circuit 200 as an example. According to an embodiment of the inventive concept, the data driving circuit 200 may be located on the non display area NDA of the first substrate DS1 through a Chip on Glass (COG) method.

Referring to FIG. 2, the frame intervals FR-O and FR-E are defined as intervals for displaying effective images. The frame intervals FR-O and FR-E may be divided into an odd frame interval FR-O and an even frame interval FR-E.

During the frame intervals FR-O and FR-E, the data signal DTS is outputted to the data lines DL1 to DLm. The data signal DTS may be divided into a first data signal DTS1 and a second data signal DTS2 according to a corresponding frame interval.

The first data signal DTS1 is outputted to the data lines DL1 to DLm during the odd frame interval FR-O, and the second data signal DTS2 is outputted to the data lines DL1 to DLm during the even frame interval FR-E.

A blank interval BLK is defined as an interval for displaying a blank image. The blank interval BLK may be defined between the frame intervals FR-O and FR-E, that is, between the odd frame interval FR-O and the even frame interval FR-E.

Additionally, the blank interval BLK may further include an interval before an effective image is displayed after the display device DD is turned on. Then, the blank interval BLK may further include an interval before the display device DD is turned off after an effective image display ends.

The gate signals GS1 to GSn may be sequentially outputted with a 45° phase difference. However, the inventive concept is not limited thereto, and in some embodiments, there may be no phase difference or the gate signals GS1 to GSn may be sequentially outputted with a phase difference other than 45°.

An interval where each of the gate signals GS1 to GSn is outputted once corresponds to one of the frame intervals FR-O and FR-E.

Figure 3:
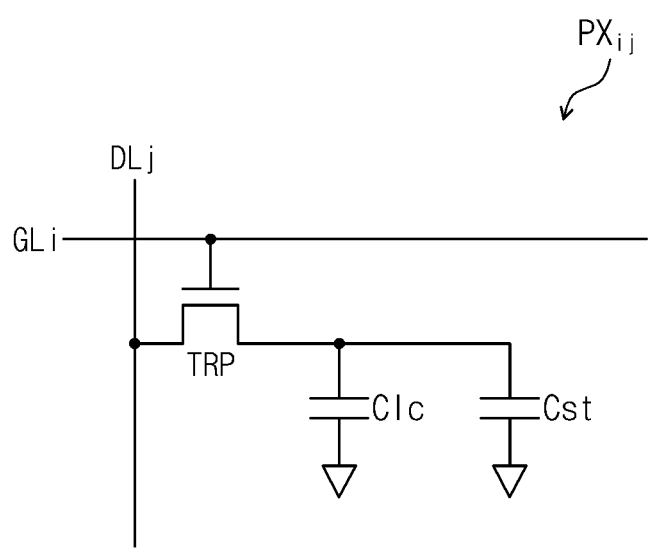
FIG. 3 is an equivalent circuit diagram of a pixel according to an embodiment of the inventive concept.
Figure 4:
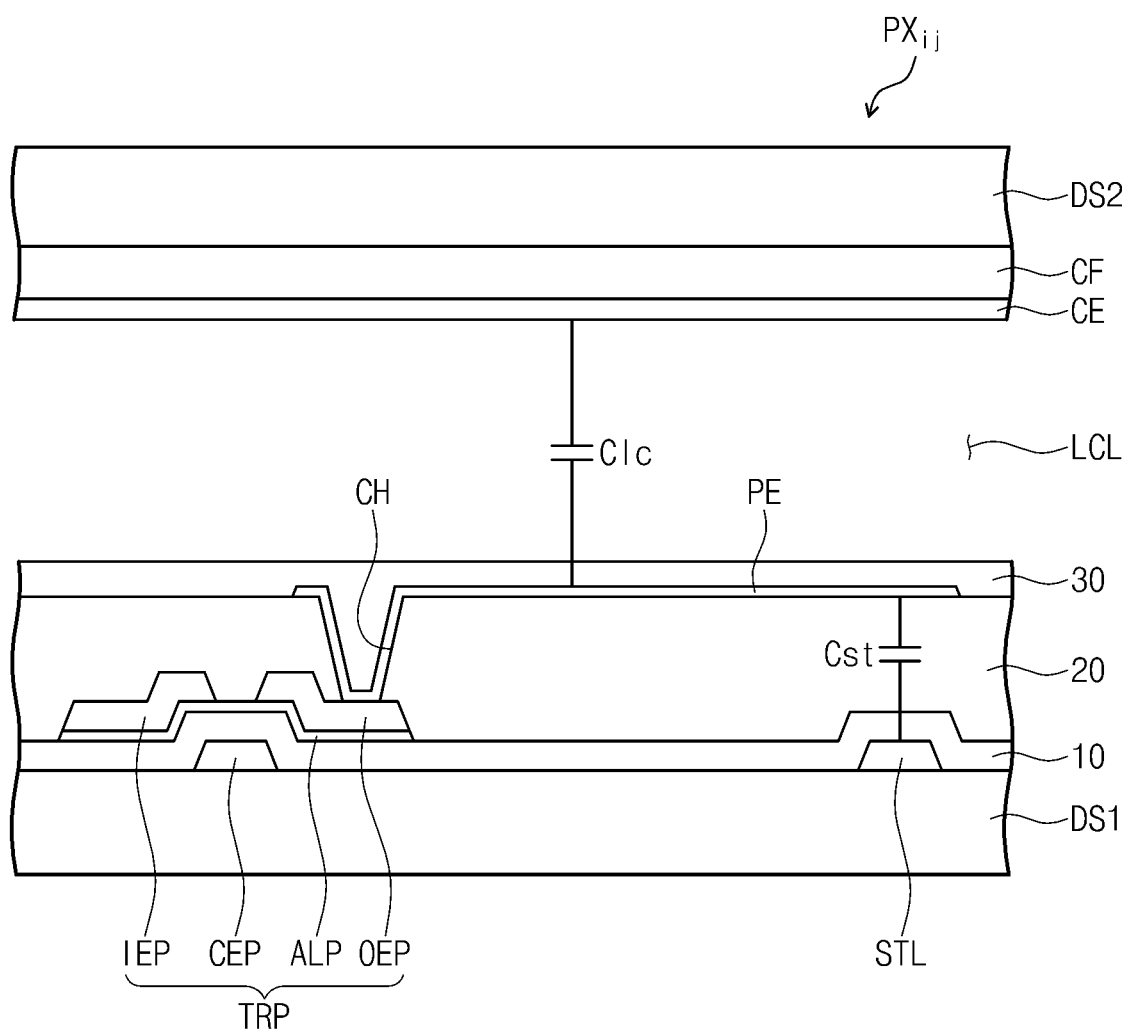
FIG. 4 is a cross-sectional view of a pixel according to an embodiment of the inventive concept.

FIG. 3 is an equivalent circuit diagram of a pixel PXij according to an embodiment of the inventive concept. FIG. 4 is a cross-sectional view of a pixel PXij according to an embodiment of the inventive concept. Each of the plurality of pixels PX11 to PXnm shown in FIG. 1 may have the same or substantially the same circuit structure as that of the pixel PXij shown in FIG. 3.

As shown in FIG. 3, the pixel PXij includes a pixel thin film transistor (hereinafter referred to as a pixel transistor) TRP, a liquid crystal capacitor Clc, and a storage capacitor Cst. According to an embodiment of the inventive concept, the storage capacitor Cst may be omitted.

The pixel transistor TRP is electrically connected to an ith gate line GLi and a jth data line DLj. The pixel transistor TRP outputs a pixel voltage corresponding to a data signal received from the jth data line DLj, in response to a gate signal received from the ith gate line GLi.

The liquid crystal capacitor Clc charges the pixel voltage outputted from the pixel transistor TRP. An arrangement of liquid crystal directors included in the liquid crystal layer LCL (e.g., see FIG. 4) is changed according to a charge amount charged in the liquid crystal capacitor Clc. The light incident to the liquid crystal layer LCL may be transmitted or blocked according to an arrangement of the liquid crystal directors.

The storage capacitor Cst is connected in parallel to the liquid crystal capacitor Clc. The storage capacitor Cst maintains or substantially maintains an arrangement of the liquid crystal directors during an interval (e.g., a predetermined interval).

As shown in FIG. 4, the pixel transistor TRP includes a control electrode CEP (hereinafter referred to as a pixel control electrode) connected to the ith gate line GLi (e.g., see FIG. 2), an activation layer ALP (hereinafter referred to as a pixel activation layer) overlapping with the pixel control electrode CEP, an input electrode IEP (hereinafter referred to as a pixel input electrode) connected to the jth data line DLj (e.g., see FIG. 2), and an output electrode OEP spaced from the pixel input electrode IEP.

The liquid crystal capacitor Clc includes a pixel electrode PE and a common electrode CE. The storage capacitor Cst includes the pixel electrode PE and a portion of a storage line STL overlapping with the pixel electrode PE.

The ith gate line GLi and the storage line STL are located on one surface (e.g., a top surface) of the first substrate DS1. The pixel control electrode CEP is connected to (e.g., extended or branched from) the ith gate line GLi. The ith gate line GLi and the storage line STL may include a metal (e.g., such as Al, Ag, Cu, Mo, Cr, Ta, Ti, etc.) or an alloy thereof. The ith gate line GLi and the storage line STL may have a multilayer structure, for example, may include a Ti layer and/or a Cu layer.

A first insulating layer 10 covering the pixel control electrode CEP and the storage line STL is located on one surface (e.g., a top surface) of the first substrate DS1. The first insulating layer 10 may include at least one of an inorganic material and an organic material. The first insulating layer 10 may be an organic layer and/or an inorganic layer. The first insulating layer 10 may have a multilayer structure, for example, may include a silicon nitride layer and/or a silicon oxide layer.

The activation layer ALP overlapping with the pixel control electrode CEP is located on the first insulating layer 10. The pixel activation layer ALP may include a semiconductor layer and an ohmic contact layer.

The pixel activation layer ALP may include amorphous silicon or poly silicon. Additionally, the pixel activation layer ALP may include a metal oxide semiconductor.

The pixel output electrode OEP and the pixel input electrode IEP are located on the pixel activation layer ALP. The pixel output electrode OEP and the pixel input electrode IEP are spaced from each other. Each of the pixel output electrode OEP and the pixel input electrode IEP may partially overlap with the pixel control electrode CEP.

Although the pixel transistor TRP having a staggered structure is shown in FIG. 4 as an example, a structure of the pixel transistor TRP is not limited thereto. For example, in another embodiment, the pixel transistor TRP may have a planar structure.

A second insulating layer 20 covering the pixel activation layer ALP, the pixel output electrode OEP, and the pixel input electrode IEP, is located on the first insulating layer 10. The second insulating layer 20 provides a flat surface. The second insulating layer 20 may include an organic material.

The pixel electrode PE is located on the second insulating layer 20. The pixel electrode PE is connected to the pixel output electrode OEP through a contact hole CH penetrating the second insulating layer 20. An alignment layer 30 covering the pixel electrode PE may be located on the second insulating layer 20.

A color filter layer CF is located on one surface (e.g., a bottom surface) of the second substrate DS2. The common electrode CE is located on the color filter layer CF. A common voltage is applied to the common electrode CE. The common voltage and the pixel voltage may have different values. An alignment layer covering the common electrode CE may be located on the common electrode CE. Another insulating layer may be located between the color filter layer CF and the common electrode CE.

The pixel electrode PE and the common electrode CE with the liquid crystal layer LCL therebetween form the liquid crystal capacitor Clc. Additionally, portions of the pixel electrode PE and the storage line STL, which are located with the first insulating layer 10 and the second insulating layer 20 therebetween, form the storage capacitor Cst. The storage line STL receives a storage voltage having a different value than that of the pixel voltage. The storage voltage may have the same value as that of the common voltage.

The cross-sectional view of the pixel PXij shown in FIG. 4 is just an example. For example, unlike in FIG. 4, at least one of the color filter layer CF and the common electrode CE may be located on the first substrate DS1. That is, a liquid crystal display panel according to an embodiment of the inventive concept may include a pixel in a Vertical Alignment (VA) mode, a Patterned Vertical Alignment (PVA) mode, an in-plane switching (IPS) mode, a fringe-field switching (FFS) mode, or a Plane to Line Switching (PLS) mode.

Figure 5A:
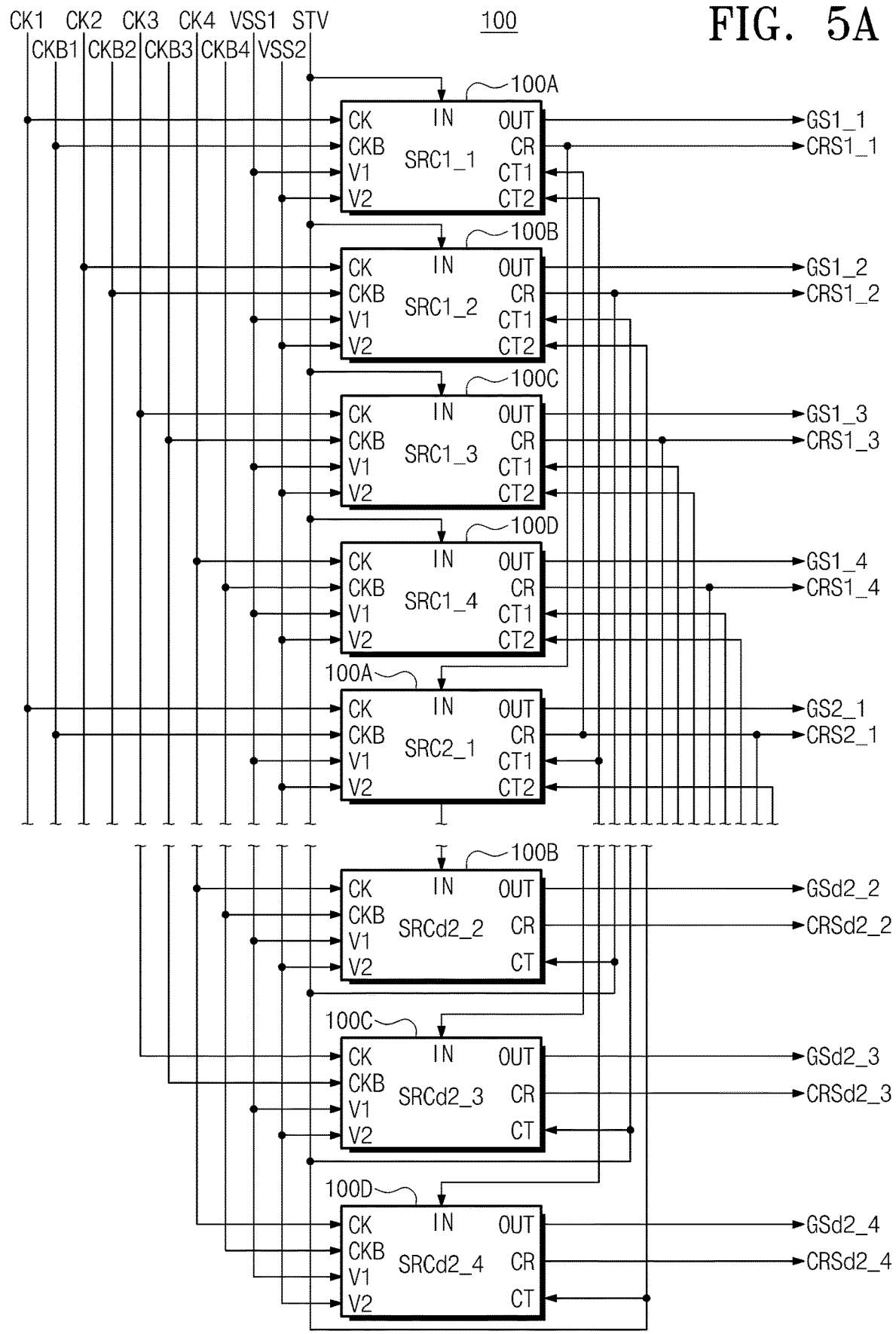
FIG. 5A is a block diagram illustrating a gate driving circuit according to an embodiment of the inventive concept.

FIG. 5A is a block diagram illustrating a gate driving circuit 100 according to an embodiment of the inventive concept. FIGS. 5B, 5C, 5D, and 5E are block diagrams of phase gate driving circuits 100A, 100B, 100C, and 100D, respectively, of the gate driving circuit 100 of FIG. 5A.

FIG. 5A illustrates a four-phase gate driving circuit 100 as an example. The four-phase gate driving circuit 100 may include four phase gate driving circuits (e.g., first, second, third, and fourth phase gate driving circuits) 100A, 100B, 100C, and 100D, and may be formed by the four phase gate driving circuits 100A, 100B, 100C, and 100D overlapping with each other.

Referring to FIGS. 1 and 5A, the four-phase gate driving circuit 100 outputs 4k gate signals GS1_1 to GSk_4 to n gate lines GL1 to GLn (where n=4k).

Figure 5B:
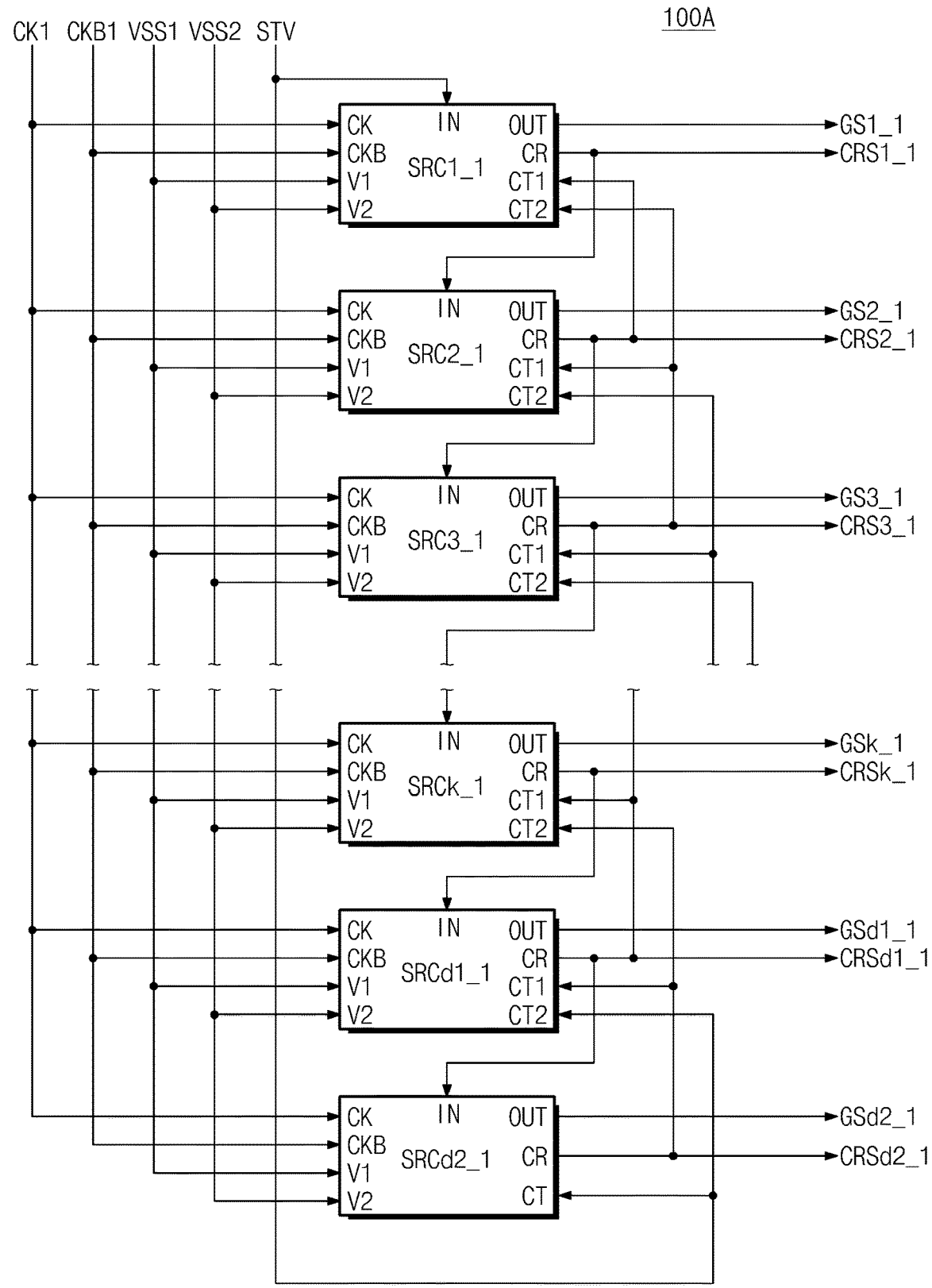
FIGS. 5B-5E are block diagrams illustrating phase gate driving circuits in a gate driving circuit of FIG. 5A.

FIG. 5B illustrates a block diagram of a first phase gate driving circuit 100A. As shown in FIG. 5B, the first phase gate driving circuit 100A includes a plurality of driving stages SRC1_1 to SRCk_1. The driving stages SRC1_1 to SRCk_1 are connected in cascade to each other.

According to an embodiment of the inventive concept, the driving stages SRC1_1 to SRCk_1 are respectively connected to corresponding gate lines from among the gate lines GL1 to GLn. The driving stages SRC1_1 to SRCk_1 respectively provide gate signals GS1_1 to GSk_1 to the corresponding gate lines from among the gate lines GL1 to GLn.

The first phase gate driving circuit 100A may further include dummy stages SRCd1_1 and SRCd2_1 connected to the driving stage SRCk_1 (e.g., a last driving stage) located at the end from among the driving stages SRC1_1 to SRCk_1. The dummy stages SRCd1_1 and SRCd2_1 are connected to corresponding dummy gate lines from among the dummy gate lines GLd.

Each of the driving stages SRC1_1 to SRCk_1 includes an output terminal OUT, a carry terminal CR, an input terminal IN, a first control terminal CT1, a second control terminal CT2, a clock terminal CK, a clock bar terminal CKB, a first voltage input terminal V1, and a second voltage input terminal V2.

The output terminal OUT of each of the driving stages SRC1_1 to SRCk_1 is connected to a corresponding gate line from among the gate lines GL1 to GLn. The gate signals GS1_1 to GSk_1 generated from the driving stages SRC1_1 to SRCk_1 are provided to corresponding gate lines from among the gate lines GL1 to GLn through the output terminals OUT.

The carry terminal CR of each of the driving stages SRC1_1 to SRCk_1 is electrically connected to the input terminal IN of a next driving stage of a corresponding driving stage. The carry terminals CR output carry signals CRS1_1 to CRSk_1.

The input terminal IN of each of the driving stages SRC1_1 to SRCk_1 receives a carry signal of a previous driving stage of a corresponding driving stage. For example, the input terminal IN of the third driving stage SRC3_1 receives the carry signal CRS2_1 of the second driving stage SRC2_1. The input terminal IN of the first driving stage SRC1_1 from among the driving stages SRC1_1 to SRCk_1 receives a start signal STV for starting the driving of the first phase gate driving circuit 100A, instead of the carry signal of a previous driving stage.

The first control terminal CT1 of each of the driving stages SRC1_1 to SRCk_1 is electrically connected to the carry terminal CR of the next driving stage of a corresponding driving stage. The first control terminal CT1 of each of the driving stages SRC1_1 to SRCk_1 receives the carry signal of the next driving stage of a corresponding driving stage. For example, the first control terminal CT1 of the second driving stage SRC2_1 receives the carry signal CRS3_1 outputted from the carry terminal CR of the third driving stage SRC3_1. However, the inventive concept is not limited thereto, and according to another embodiment of the inventive concept, the first control terminal CT1 of each of the driving stages SRC1_1 to SRCk_1 may be electrically connected to the output terminal OUT of the next driving stage of a corresponding driving stage.

The first control terminal CT1 of the last driving stage SRCk_1 located at the end of the driving stages SRC1_1 to SRCk_1 receives the carry signal CRSd1_1 outputted from the carry terminal CR of the first dummy stage SRCd1_1. The first control terminal CT1 of the first dummy stage SRCd1_1 receives the carry signal CRSd2_1 outputted from the carry terminal CR of the second dummy stage SRCd2_1.

The second control terminal CT2 of each of the driving stages SRC1_1 to SRCk_1 is electrically connected to the carry terminal CR of the second next (e.g., i+2) driving stage of a corresponding (e.g., i) driving stage. The second control terminal CT2 of each of the driving stages SRC1_1 to SRCk_1 receives the carry signal of the second next driving stage of a corresponding driving stage. For example, the second control terminal CT2 of the first driving stage SRC1_1 receives the carry signal CRS3_1 outputted from the carry terminal CR of the third driving stage SRC3_1.

The clock terminal CK of each of the driving stages SRC1_1 to SRCk_1 receives a first clock signal CK1. The clock bar terminal CKB of each of the driving stages SRC1_1 to SRCk_1 receives a first clock bar signal CKB1. A phase difference between the first clock signal CK1 and the first clock bar signal CKB1 may be about 180°.

The first voltage input terminal V1 of each of the driving stages SRC1_1 to SRCk_1 receives a first low signal VSS1. The second voltage input terminal V2 of each of the driving stages SRC1_1 to SRCk_1 receives a second low signal VSS2. A voltage of the second low signal VSS2 is lower than a voltage of the first low signal VSS1. A voltage of the first low signal VSS1, for example, may be about −9V to −5V. A voltage of the second low signal VSS2, for example, may be about −14V to −10V during the frame intervals FR-O and FR-E.

According to an embodiment of the inventive concept, in relation to each of the driving stages SRC1_1 to SRCk_1, one of an output terminal OUT, a carry terminal CR, an input terminal IN, a first control terminal CT1, a second control terminal CT2, a clock terminal CK, a clock bar terminal CKB, a first voltage input terminal V1, and a second voltage input terminal V2 may be omitted, and/or other terminals may be further included. For example, one of the first voltage input terminal V1 and the second voltage input terminal V2 may be omitted. Additionally, connection relationships of the driving stages SRC1_1 to SRCk_1 may be variously changed.

Figure 5C:
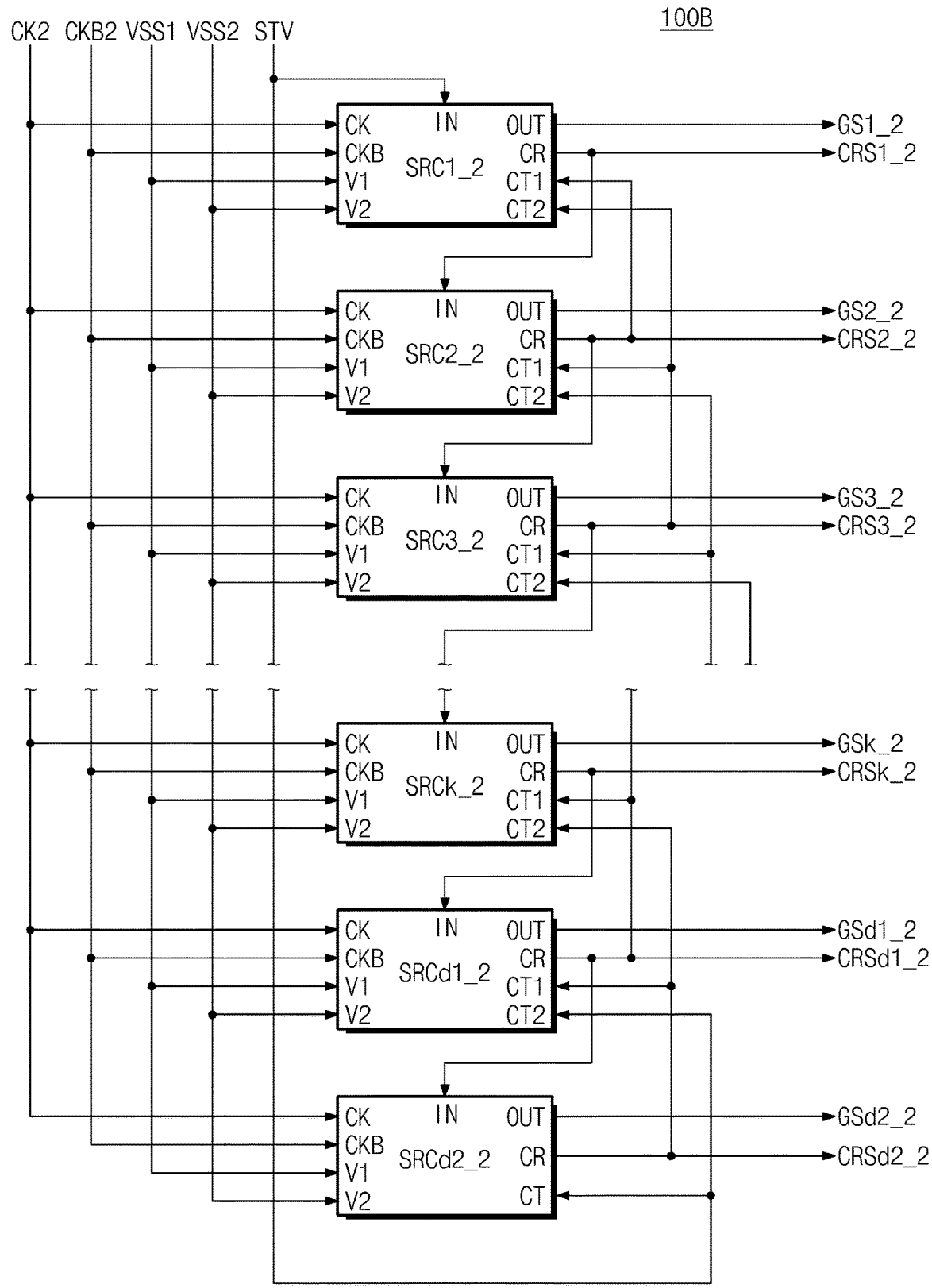

FIG. 5C illustrates a block diagram of a second phase gate driving circuit 100B. As shown in FIG. 5C, the second phase gate driving circuit 100B includes a plurality of driving stages SRC1_2 to SRCk_2. The driving stages SRC1_2 to SRCk_2 are connected in cascade to each other.

The clock terminal CK of each of the driving stages SRC1_2 to SRCk_2 receives a second clock signal CK2. The clock bar terminal CKB of each of the driving stages SRC1_2 to SRCk_2 receives a second clock bar signal CKB2. A phase difference between the second clock signal CK2 and the second clock bar signal CKB2 may be about 180°. A phase of the second clock signal CK2 may be slower by about 45° than a phase of the first clock signal CK1.

Except for the second clock signal CK2 and the second clock bar signal CKB2, descriptions for the second phase gate driving circuit 100B and the first phase gate driving circuit 100A are the same or substantially the same, so repeated description thereof is omitted.

Figure 5D:
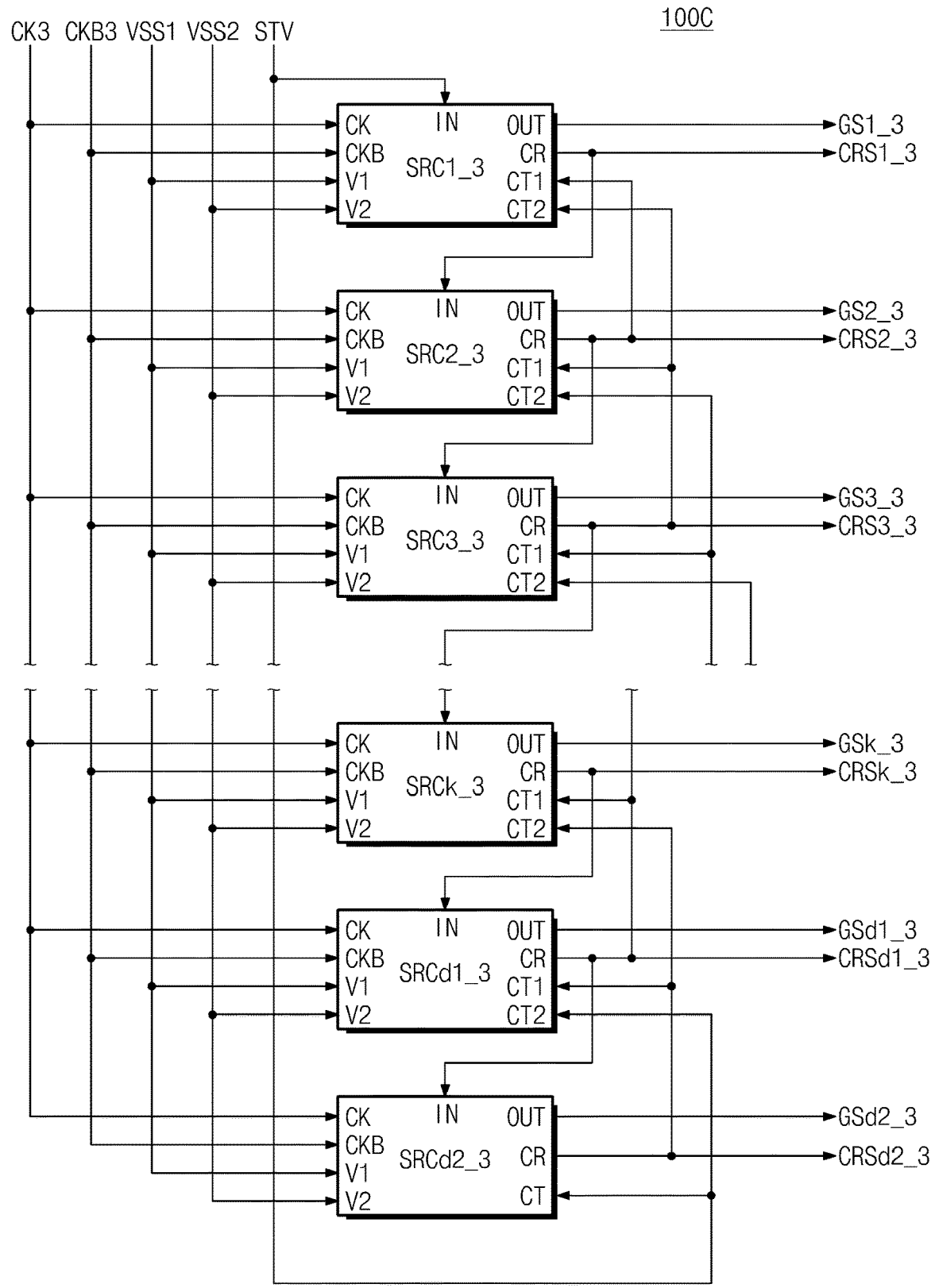

FIG. 5D illustrates a block diagram of a third phase gate driving circuit 100C. As shown in FIG. 5D, the third phase gate driving circuit 100C includes a plurality of driving stages SRC1_3 to SRCk_3. The driving stages SRC1_3 to SRCk_3 are connected in cascade to each other.

The clock terminal CK of each of the driving stages SRC1_3 to SRCk_3 receives a third clock signal CK3. The clock bar terminal CKB of each of the driving stages SRC1_3 to SRCk_3 receives a third clock bar signal CKB3. A phase difference between the third clock signal CK3 and the third clock bar signal CKB3 may be about 180°. A phase of the third clock signal CK3 may be slower by about 90° than a phase of the first clock signal CK1.

Except for the third clock signal CK3 and the third clock bar signal CKB3, descriptions for the third phase gate driving circuit 100C and the first phase gate driving circuit 100A are the same or substantially the same, so repeated description thereof is omitted.

Figure 5E:
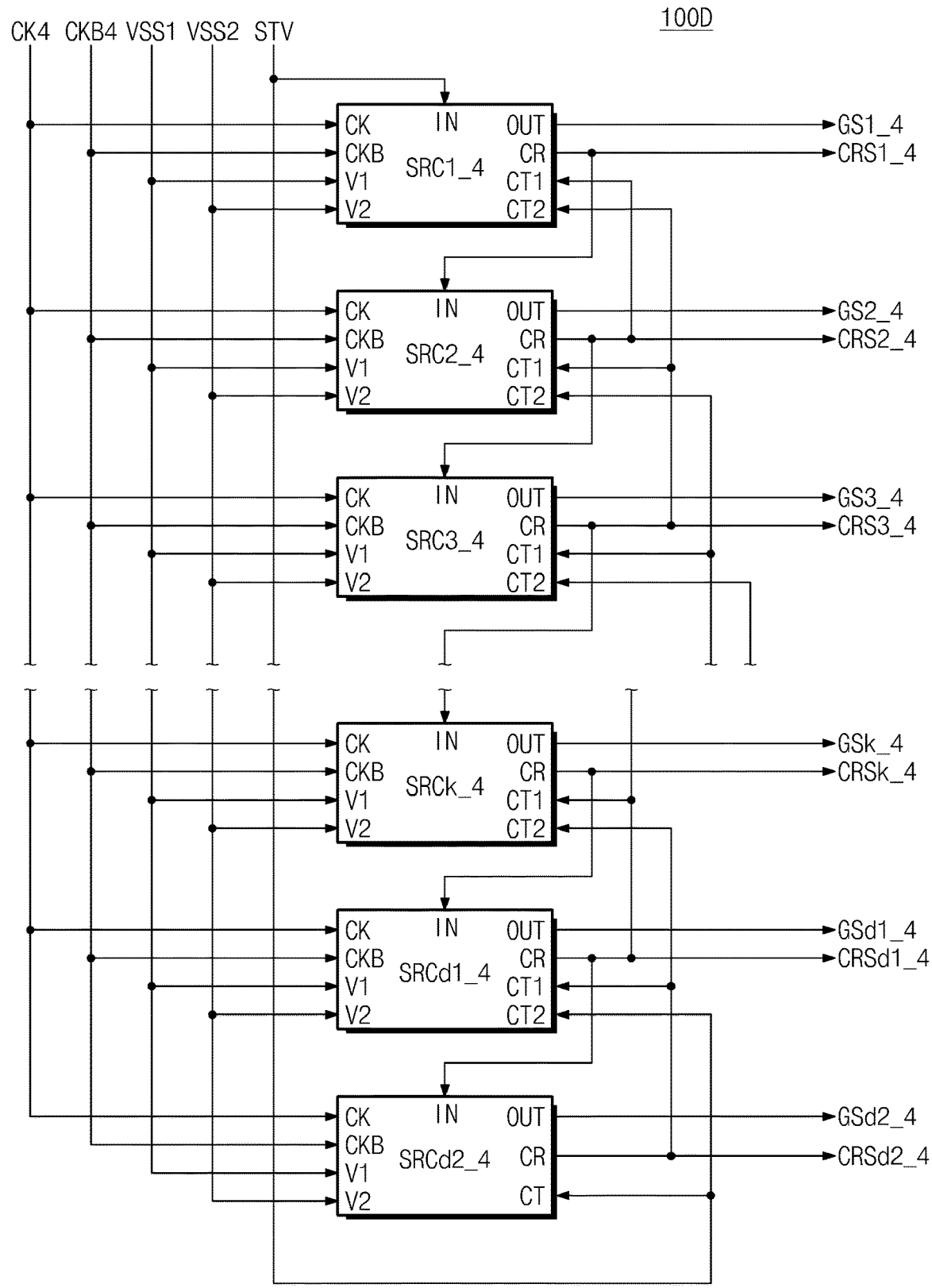

FIG. 5E illustrates a block diagram of a fourth phase gate driving circuit 100D. As shown in FIG. 5E, the fourth phase gate driving circuit 100D includes a plurality of driving stages SRC1_4 to SRCk_4. The driving stages SRC1_4 to SRCk_4 are connected in cascade to each other.

The clock terminal CK of each of the driving stages SRC1_4 to SRCk_4 receives a fourth clock signal CK4. The clock bar terminal CKB of each of the driving stages SRC1_4 to SRCk_4 receives a fourth clock bar signal CKB4. A phase difference between the fourth clock signal CK4 and the fourth clock bar signal CKB4 may be about 180°. A phase of the fourth clock signal CK4 may be slower by about 135° than a phase of the first clock signal CK1.

Except for the fourth clock signal CK4 and the fourth clock bar signal CKB4, descriptions for the fourth phase gate driving circuit 100D and the first phase gate driving circuit 100A are the same or substantially the same, so repeated description thereof is omitted.

Figure 6:
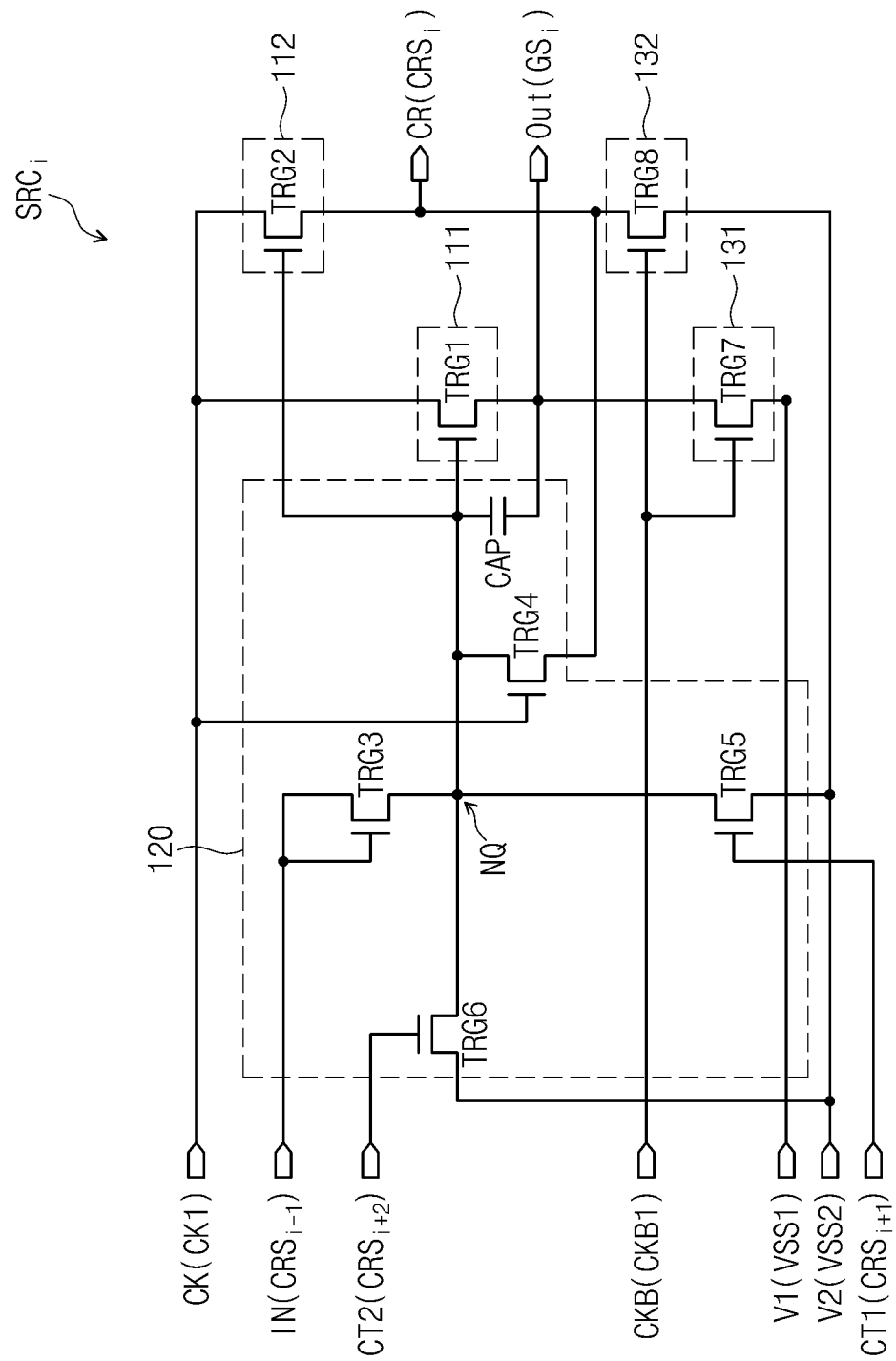
FIG. 6 is a circuit diagram illustrating an ith driving stage from among a plurality of stages shown in FIG. 5B.
Figure 7:
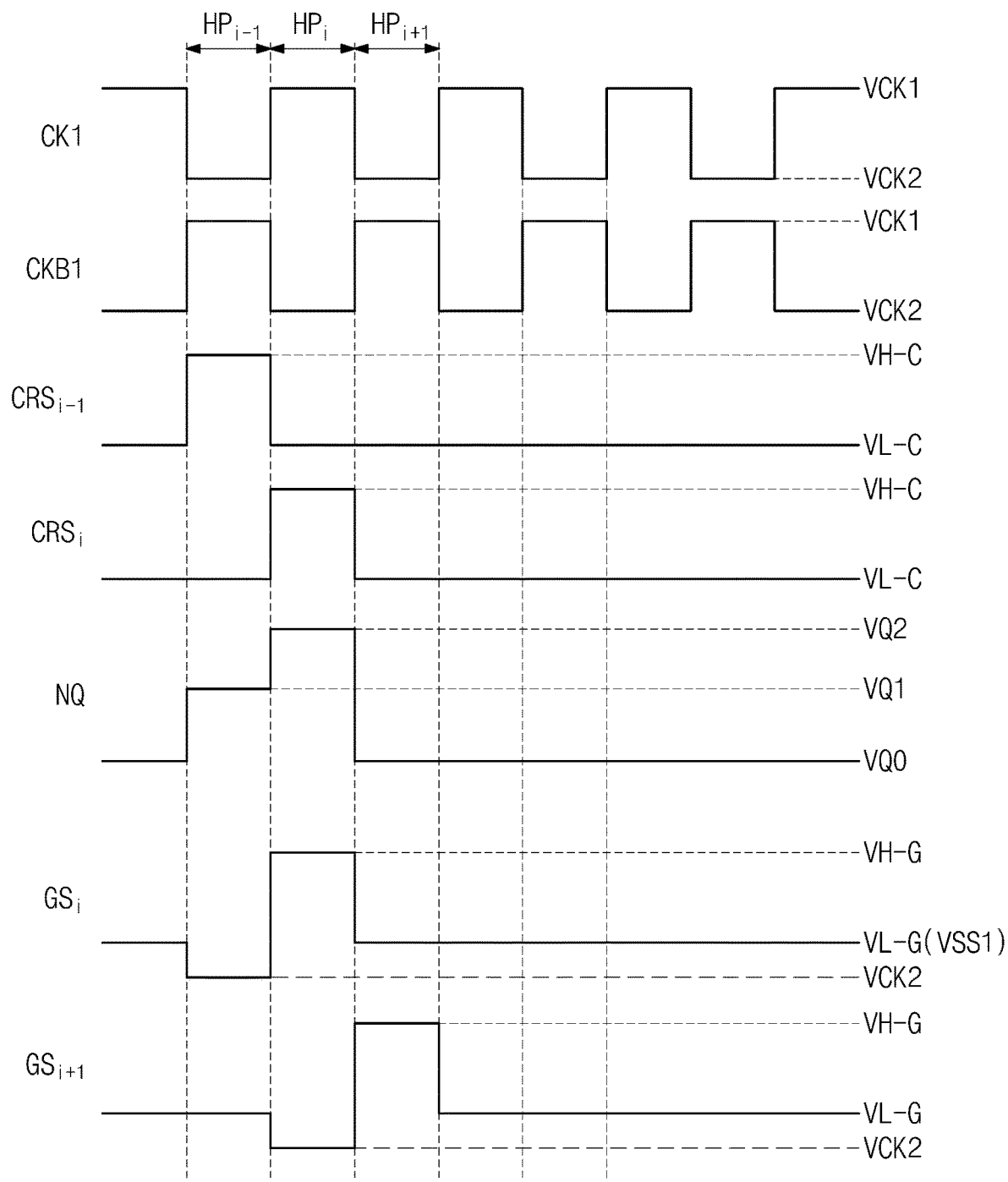
FIG. 7 is a waveform diagram illustrating signals of an ith driving stage shown in FIG. 6.

FIG. 6 is a view illustrating an ith driving stage SRCi from among the plurality of driving stages SRC1_1 to SRCk_1 shown in FIG. 5B. FIG. 7 is a view illustrating an input/output signal waveform diagram of an ith driving stage SRCi shown in FIG. 6. Each of the plurality of driving stages SRC1_1 to SRCk_1 shown in FIG. 5B may have the same or substantially the same circuit structure as that of the ith driving stage SRCi.

Referring to FIG. 6, the ith driving stage SRCi includes output units 111 and 112, a control unit (e.g., a controller) 120, and pull-down units 131 and 132. The output units 111 and 112 include a first output unit 111 for outputting an ith gate signal $GS_i$, and a second output unit 112 for outputting an ith carry signal $CRS_i$. The pull-down units 131 and 132 include a first pull-down unit 131 for pulling down the output terminal OUT, and the second pull-down unit 132 for pulling down the carry terminal CR.

The ith driving stage SRCi includes a plurality of driving transistors TRG1 to TRG8 (hereinafter referred to as driving transistors TRG). The driving transistors TRG are divided into output transistors TRG1 and TRG2, control transistors TRG3, TRG4, TRG5, and TRG6, and pull-down transistors TRG7 and TRG8 according to their roles.

However, the inventive concept is not limited thereto, and the circuit structure of the ith driving stage SRCi may suitably vary.

The first output unit 111 includes the first output transistor TRG1. The first output transistor TRG1 includes an input electrode for receiving a first clock signal CK1, a control electrode connected to a Q-node NQ, and an output electrode for outputting an ith gate signal $GS_i$.

The second output unit 112 includes the second output transistor TRG2. The second output transistor TRG2 includes an input electrode for receiving a first clock signal CK1, a control electrode connected to the Q-node NQ, and an output electrode for outputting an ith carry signal $CRS_i$.

As shown in FIG. 7, each of the first clock signal CK1 and the first clock bar signal CKB1 swings between a first clock voltage VCK1 and a second clock voltage VCK2. The first clock voltage VCK1 may be, for example, about 15V to about 35V. The second clock voltage VCK2 may be, for example, about −15V to about −9V. The second clock voltage VCK2 may have the same or substantially the same level as that of the second low signal VSS2.

The ith gate signal $GS_i$ includes a gate-off signal having a low voltage and a gate-on signal having a relatively high voltage. A low voltage VL-G of the ith gate signal $GS_i$ may be the same or substantially the same as a voltage of the first low signal VSS1. The low voltage VL-G may be, for example, about −8V to about −5V.

The ith gate signal $GS_i$ may have the same or substantially the same level as that of the second clock voltage VCK2 of the first clock signal CK1 during some intervals. Before the ith gate signal $GS_i$ becomes a high voltage VH-G, the second clock voltage VCK2 of the first clock signal CK1 is outputted according to the pre-charged Q-node NQ.

The high voltage VH-G of the ith gate signal $GS_i$ may have the same or substantially the same level as that of the first clock voltage VCK1 of the first clock signal CK1.

The ith carry signal $CRS_i$ includes a carry-off signal having a low voltage and a carry-on signal having a relatively high voltage. Since the ith carry signal $CRS_i$ is generated based on the first clock signal CK1, it has the same or substantially the same level as that of the first clock voltage VCK1.

The control unit 120 controls operations of the first output unit 111 and the second output unit 112. The control unit 120 turns on the first output unit 111 and the second output unit 112 in response to the ith carry signal $CRS_{i-1}$ outputted from the i−1th driving stage SRCi-1. The control unit 120 turns off the first output unit 111 and the second output unit 112 in response to the i+1th carry signal $CRS_{i+1}$ and the i+2th carry signal $CRS_{i+2}$.

The control unit 120 includes a first control transistor TRG3, a second control transistors TRG4, a third control transistors TRG5, a fourth control transistor TRG6, and a capacitor CAP.

The first control transistor TRG3 outputs a control signal to the Q-node NQ for controlling the potential of the Q-node NQ.

FIG. 7 is a view illustrating a horizontal interval HP$_i$ (hereinafter referred to as an ith horizontal interval) where an ith gate signal GS$_i$ is outputted, an immediately previous horizontal interval HP$_{i-1}$ (hereinafter referred to as an i−1th horizontal interval), and an immediately next (e.g., immediately after) horizontal interval HP$_{i+1}$ (hereinafter referred to as an i+1th horizontal interval), from among a plurality of horizontal intervals.

The first control transistor TRG3 is connected in a diode form (e.g., diode connected) between the input terminal IN and the Q-node NQ, to allow current to flow only in a direction from the input terminal IN to the Q-node NQ. The first control transistor TRG3 includes a control electrode and an input electrode that are commonly connected to the input terminal IN, and an output electrode connected to the Q-node NQ.

The capacitor CAP is connected between an output electrode of the first output transistor TRG1 and a control electrode (or the Q-node NQ) of the first output transistor TRG1.

The second control transistor TRG4 provides a signal of the carry terminal CR to the Q-node NQ. The second control transistor TRG4 includes a control electrode connected to the clock terminal CK, an input electrode connected to the carry terminal CR, and an output electrode connected to the Q-node NQ.

The third control transistor TRG5 is connected between the second voltage input terminal V2 and the Q-node NQ. The control electrode of the third control transistor TRG5 is connected to the first control terminal CT1. The third control transistor TRG5 provides a second low signal VSS2 to the Q-node NQ in response to the i+1th carry signal CRS$_{i+1}$. According to another embodiment of the inventive concept, the third control transistor TRG5 may be turned on by the i+1th gate signal GS$_{i+1}$.

The fourth control transistor TRG6 is connected between the second voltage input terminal V2 and the Q-node NQ. The control electrode of the fourth control transistor TRG6 is connected to the second control terminal CT2. The fourth control transistor TRG6 provides a second low signal VSS2 to the Q-node NQ in response to the i+2th carry signal CRS$_{i+2}$. According to another embodiment of the inventive concept, the fourth control transistor TRG6 may be turned on by the i+2th gate signal GS$_{i+2}$.

The structure of the ith driving stage SRCi shown in FIG. 6 is just an example embodiment, and the inventive concept is not limited thereto. For example, the ith driving stage SRCi may further include an inverter unit without the clock bar terminal CKB. Additionally, one of the third control transistor TRG5 and the fourth control transistor TRG6 may be connected to the first voltage input terminal V1 instead of the second voltage input terminal V2.

As shown in FIG. 7, the potential of the Q-node NQ is raised to a first high voltage VQ1 by the i−1th carry signal CRS$_{i-1}$ during the i−1th horizontal interval HP$_{i-1}$. When the i−1th carry signal CRS$_{i-1}$ is applied to the Q-node NQ, the capacitor CAP is charged with a voltage corresponding thereto. The ith gate signal GS$_i$ is outputted during the ith horizontal interval HP$_i$. At this point, the Q-node NQ is boosted from the first high voltage VQ1 to the second high voltage VQ2.

During the i+1th horizontal interval HP$_{i+1}$, a voltage of the Q-node NQ is changed (e.g., decreased) to a Q-node base voltage VQ0. Accordingly, the first output transistor TRG1 and the second output transistor TRG2 are turned off.

The first pull-down unit 131 includes a first pull-down transistor TRG7. The first pull-down transistor TRG7 includes an input electrode connected to a first voltage input terminal V1, a control electrode connected to a clock bar terminal CKB, and an output electrode connected to the output electrode of the first output transistor TRG1. According to another embodiment of the inventive concept, the input electrode of the first pull-down transistor TRG7 may be connected to the second voltage input terminal V2.

As shown in FIG. 7, a voltage of the ith gate signal GS$_i$ after the i+1th horizontal interval HP$_{i+1}$ corresponds to a voltage of the output electrode of the first pull-down transistor TRG7. During the i+1th horizontal interval HP$_{i+1}$, the first pull-down transistor TRG7 provides a first low signal VSS1 to the output electrode of the first output transistor TRG1 in response to the first clock bar signal CKB1.

The second pull-down unit 132 includes a second pull-down transistor TRG8. The second pull-down transistor TRG8 includes an input electrode connected to a second voltage input terminal V2, a control electrode connected to a clock bar terminal CKB, and an output electrode connected to the output electrode of the second output transistor TRG2. According to another embodiment of the inventive concept, the input electrode of the second pull-down transistor TRG8 may be connected to the first voltage input terminal V1.

As shown in FIG. 7, a voltage of the ith carry signal CRS$_i$ after the i+1th horizontal interval HP$_{i+1}$ corresponds to a voltage of the output electrode of the second pull-down transistor TRG8. During the i+1th horizontal interval HP$_{i+1}$, the second pull-down transistor TRG8 provides a second low signal VSS2 to the output electrode of the second output transistor TRG2 in response to the first clock bar signal CKB1.

FIGS. 8, 9, 10, and 11 are waveform diagrams illustrating clock signals CK1, CK2, CK3, and CK4, and clock bar signals CKB1, CKB2, CKB3, and CKB4, according to an embodiment of the inventive concept.

Figure 8:
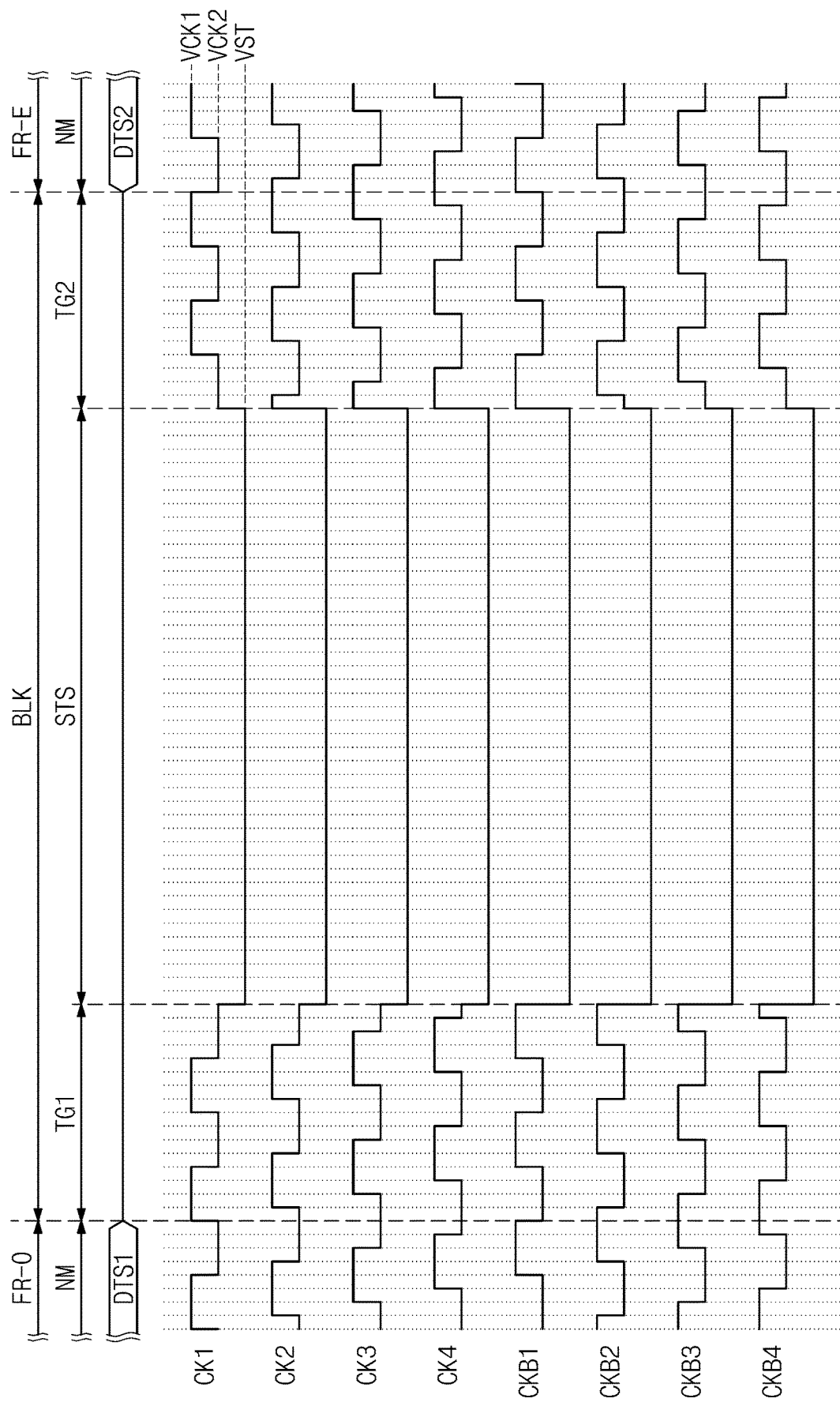
FIGS. 8-11 are waveform diagrams illustrating clock signals and clock bar signals according to an embodiment of the inventive concept.

Referring to FIG. 8, each of the clock signals CK1, CK2, CK3, and CK4, and each of the clock bar signals CKB1, CKB2, CKB3, and CKB4, may include a stabilization interval STS and a normal interval NM.

The stabilization interval STS corresponds to a blank interval BLK, and includes a low interval having a stabilization voltage VST. The stabilization voltage VST is lower than the second clock voltage VCK2. The stabilization voltage VST may be, for example, about −50V to about −15V.

The normal interval NM corresponds to frame intervals FR-O and FR-E. During the normal interval NM, the clock signals CK1, CK2, CK3, and CK4 and the clock bar signals CKB1, CKB2, CKB3, and CKB4 swing between the first clock voltage VCK1 and the second clock voltage VCK2. During the normal interval NM, the clock signals CK1, CK2, CK3, and CK4 and the clock bar signals CKB1, CKB2, CKB3, and CKB4 may have different phases.

Each of the clock signals CK1, CK2, CK3, and CK4 and the clock bar signals CKB1, CKB2, CKB3, and CKB4 may further include toggle intervals TG1 and TG2. The toggle intervals TG1 and TG2 are divided into a first toggle interval TG1 and a second toggle interval TG2.

The first toggle interval TG1 may be defined as an interval after the normal interval NM and before the stabilization interval STS. Each of the clock signals CK1, CK2, CK3, and CK4 and the clock bar signals CKB1, CKB2, CKB3, and CKB4 swings at least once during the first toggle interval TG1. During the first toggle interval TG1, a preparation process for starting the stabilization interval STS may be performed by turning on the transistors of which the control electrodes thereof receive the clock signals CK1, CK2, CK3, and CK4 and/or the clock bar signals CKB1, CKB2, CKB3, and CKB4.

The second toggle interval TG2 may be defined as an interval after the stabilization interval STS and before the normal interval NM. Each of the clock signals CK1, CK2, CK3, and CK4 and the clock bar signals CKB1, CKB2, CKB3, and CKB4 swings at least once during the second toggle interval TG2. During the second toggle interval TG2, a preparation process for starting the normal interval NM may be performed by turning on the transistors of which the control electrodes thereof receive the clock signals CK1, CK2, CK3, and CK4 and/or the clock bar signals CKB1, CKB2, CKB3, and CKB4.

Figure 9:
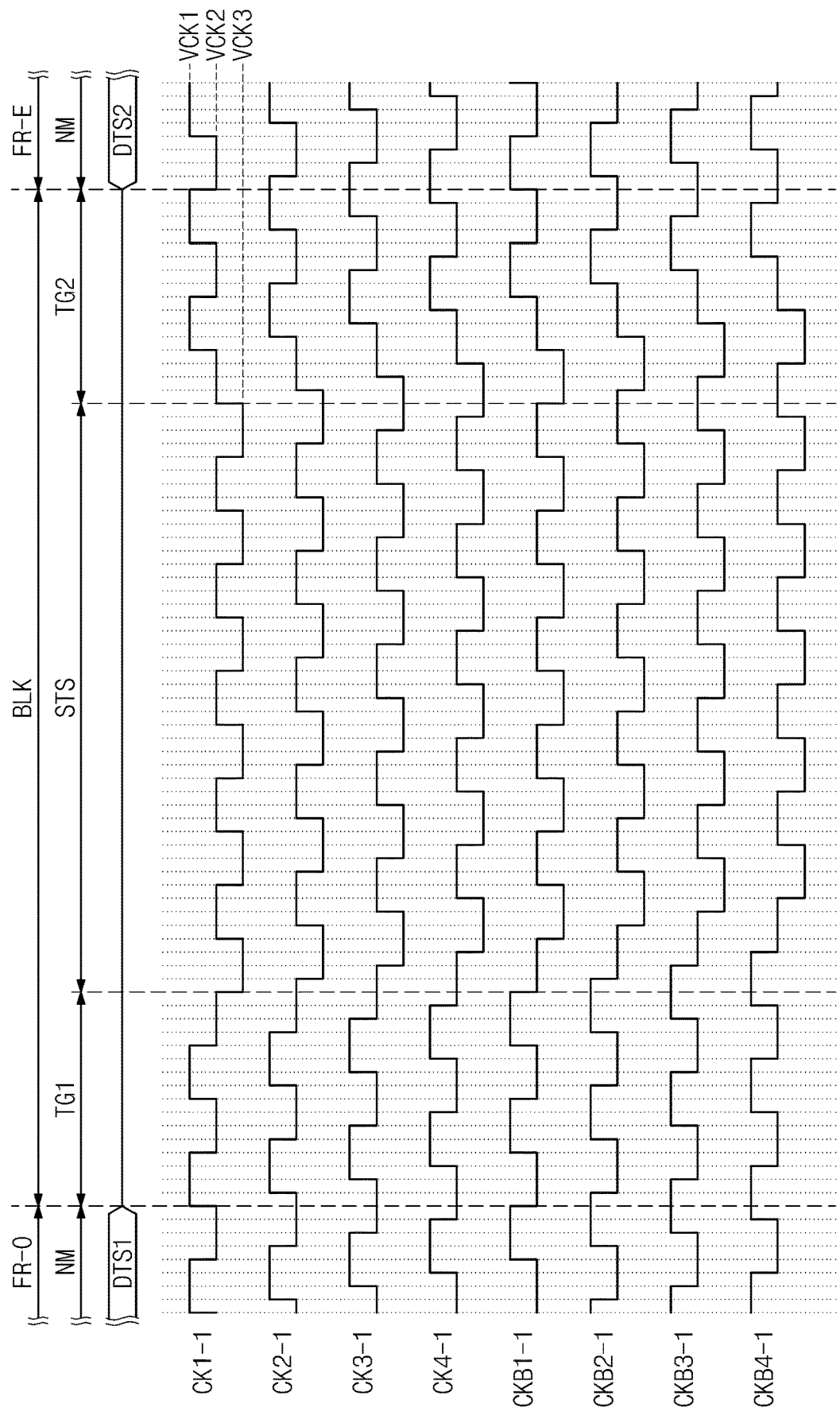

Referring to FIG. 9, each of the clock signals CK1-1, CK2-1, CK3-1, and CK4-1, and each of the clock bar signals CKB1-1, CKB2-1, CKB3-1, and CKB4-1, may include a stabilization interval STS and a normal interval NM.

The stabilization interval STS corresponds to a blank interval BLK, and includes a low interval having a third clock voltage VCK3. The third clock voltage VCK3 is lower than the second clock voltage VCK2. The third clock voltage VCK3 may be, for example, about −50V to about −15V. During the stabilization interval STS, the clock signals CK1-1, CK2-1, CK3-1, and CK4-1 and the clock bar signals CKB1-1, CKB2-1, CKB3-1, and CKB4-1 swing between the second clock voltage VCK2 and the third clock voltage VCK3.

Descriptions for the normal interval NM and the toggle intervals TG1 and TG2 are the same or substantially the same as the descriptions for those in FIG. 8, so repeated description thereof will be omitted.

Figure 10:
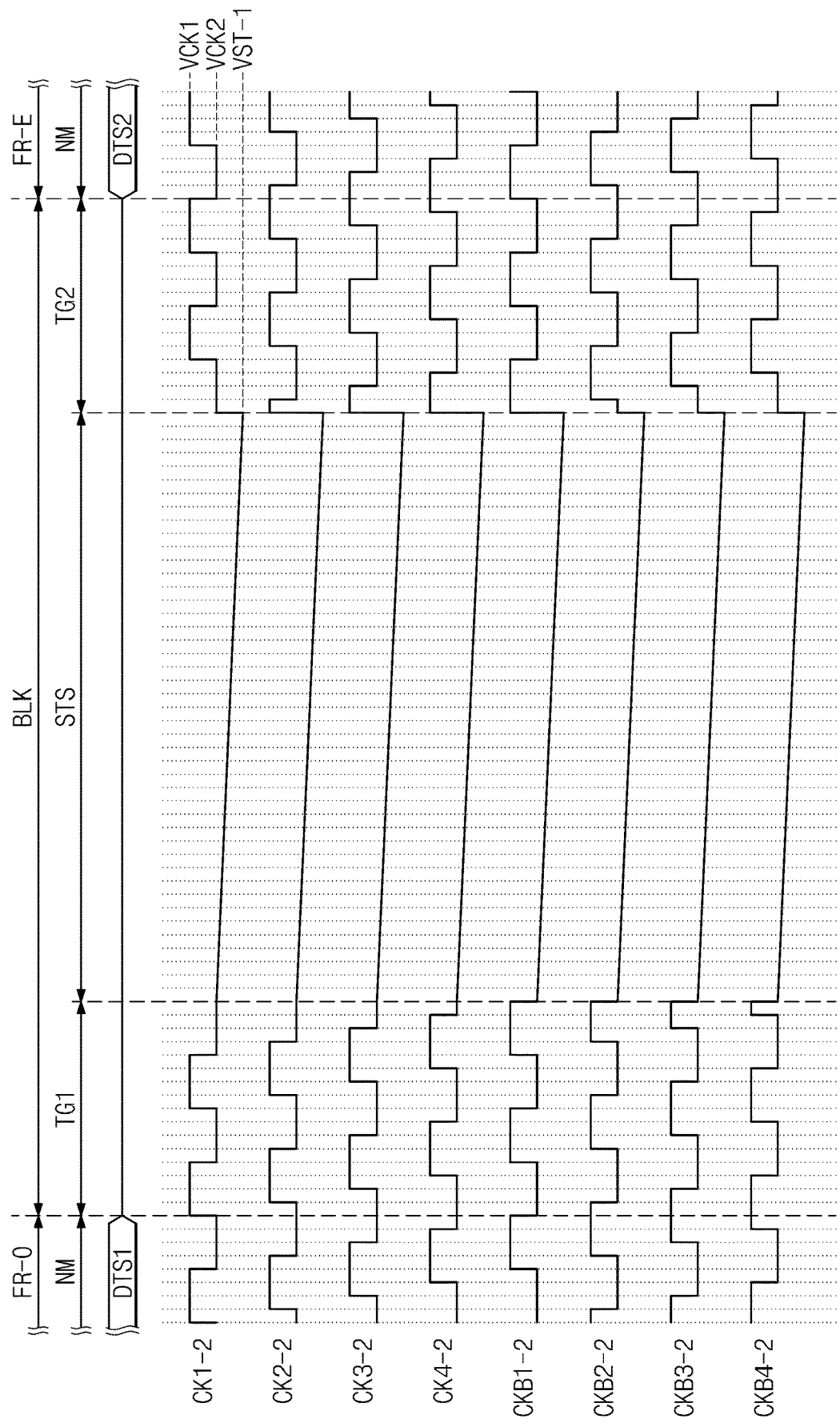

Referring to FIG. 10, each of the clock signals CK1-2, CK2-2, CK3-2, and CK4-2, and each of the clock bar signals CKB1-2, CKB2-2, CKB3-2, and CKB4-2, may include a stabilization interval STS and a normal interval NM.

The stabilization interval STS corresponds to a blank interval BLK. During the stabilization interval STS, the clock signals CK1-2, CK2-2, CK3-2, and CK4-2 and the clock bar signals CKB1-2, CKB2-2, CKB3-2, and CKB4-2 become smaller (e.g., is reduced) from the second clock voltage VCK2 to a stabilization voltage VST-1 that is lower than the second clock voltage VCK2. The stabilization voltage VST-1 may be, for example, about −50V to about −15V.

Although it is shown with reference to FIG. 10 that voltages of the clock signals CK1-2, CK2-2, CK3-2, and CK4-2 and the clock bar signals CKB1-2, CKB2-2, CKB3-2, and CKB4-2 become smaller (e.g., is reduced) linearly, the inventive concept is not limited thereto.

Descriptions for the normal interval NM and the toggle intervals TG1 and TG2 are the same or substantially the same as the descriptions for those in FIG. 8, so repeated description thereof will be omitted.

Figure 11:
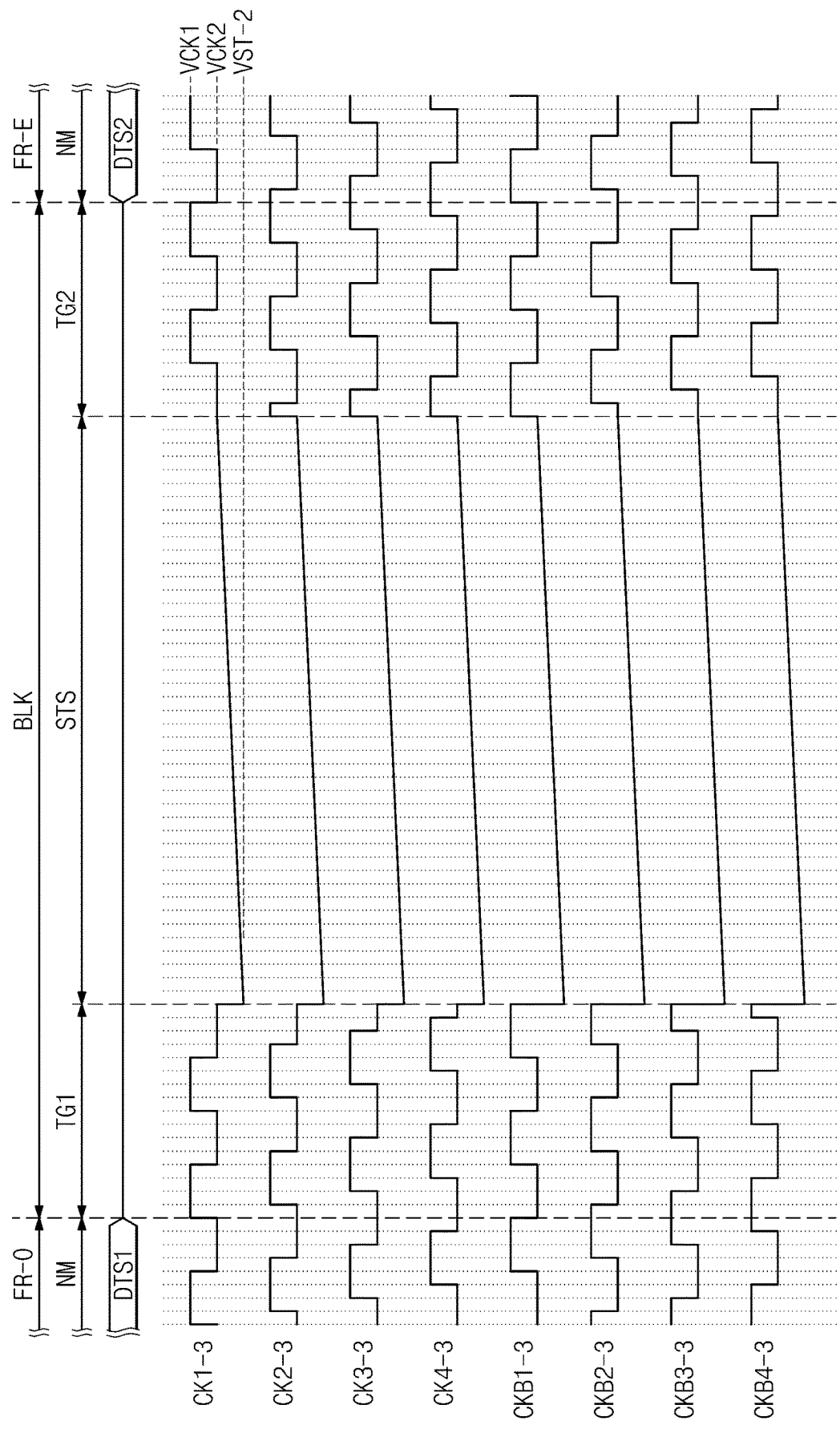

Referring to FIG. 11, each of the clock signals CK1-3, CK2-3, CK3-3, and CK4-3, and each of the clock bar signals CKB1-3, CKB2-3, CKB3-3, and CKB4-3, may include a stabilization interval STS and a normal interval NM.

The stabilization interval STS corresponds to a blank interval BLK. During the stabilization interval STS, voltages of the clock signals CK1-3, CK2-3, CK3-3, and CK4-3 and the clock bar signals CKB1-3, CKB2-3, CKB3-3, and CKB4-3 become larger (e.g., is increased) from the stabilization voltage VST-2 to the second clock voltage VCK2 that is larger than the stabilization voltage VST-2. The stabilization voltage VST-2 may be, for example, about −50V to about −15V.

Although it is shown with reference to FIG. 11 that voltages of the clock signals CK1-3, CK2-3, CK3-3, and CK4-3 and the clock bar signals CKB1-3, CKB2-3, CKB3-3, and CKB4-3 are increased linearly, the inventive concept is not limited thereto.

Descriptions for the normal interval NM and the toggle intervals TG1 and TG2 are the same or substantially the same as the descriptions for those in FIG. 8, so repeated description thereof will be omitted.

Figure 12:
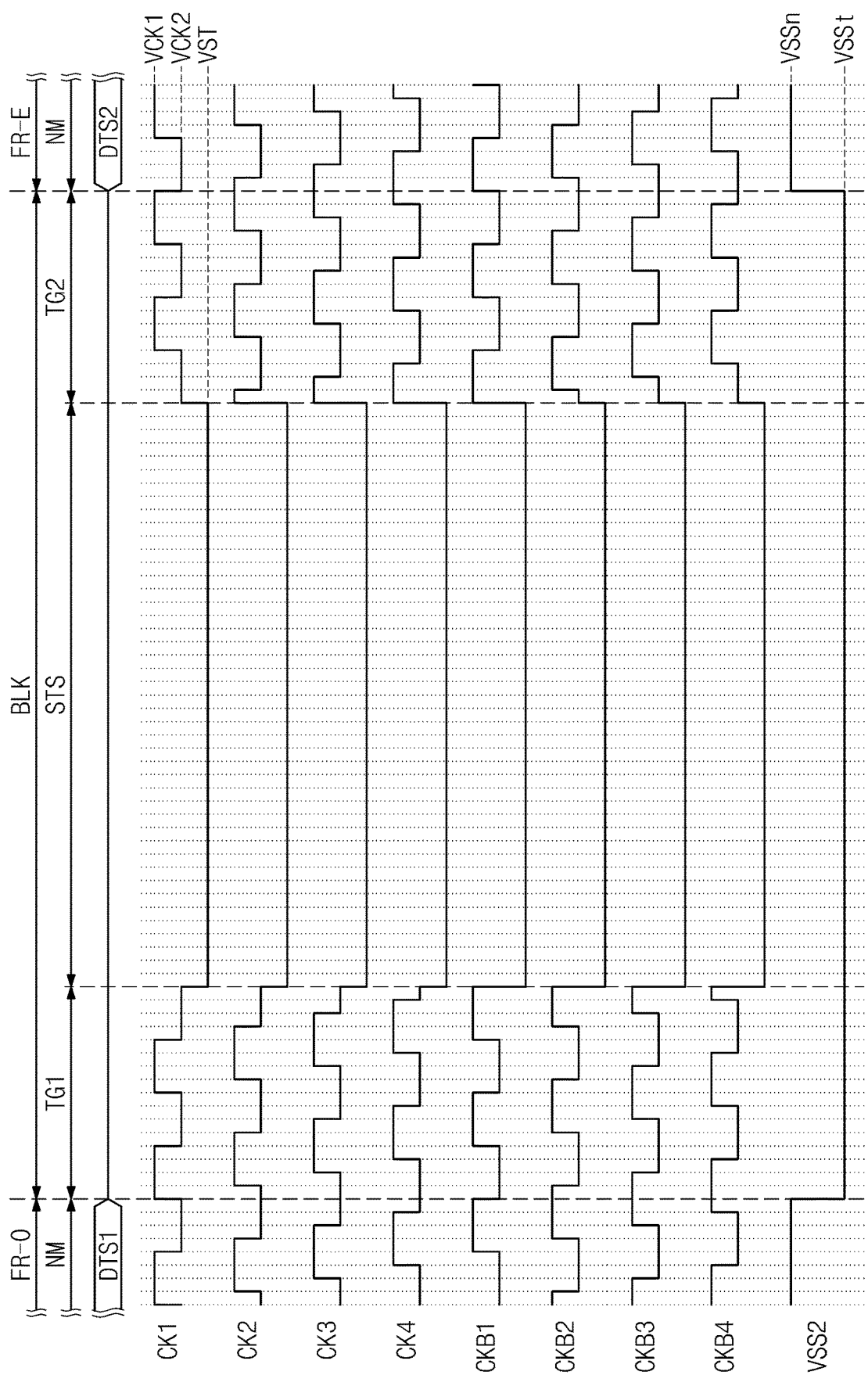
FIG. 12 is a waveform diagram illustrating clock signals, clock bar signals, and a second low signal according to an embodiment of the inventive concept.

FIG. 12 is a waveform diagram illustrating clock signals CK1, CK2, CK3, and CK4, clock bar signals CKB1, CKB2, CKB3, and CKB4, and a second low signal VSS2 according to an embodiment of the inventive concept.

Descriptions for the clock signals CK1, CK2, CK3, and CK4 and the clock bar signals CKB1, CKB2, CKB3, and CKB4 are the same or substantially the same as the descriptions for those in FIG. 8, so repeated description thereof will be omitted.

The second low signal VSS2 may have a normal low voltage VSSn during frame intervals FR-O and FR-E. The normal low voltage VSSn may be, for example, about −12V to about −10V.

The second low signal VSS2 may have a stabilization low voltage VSSt during a blank interval BLK. The stabilization low voltage VSSt is smaller than the normal low voltage VSSn. The stabilization low voltage VSSt may be, for example, about −50V to about −15V.

Figure 13A:
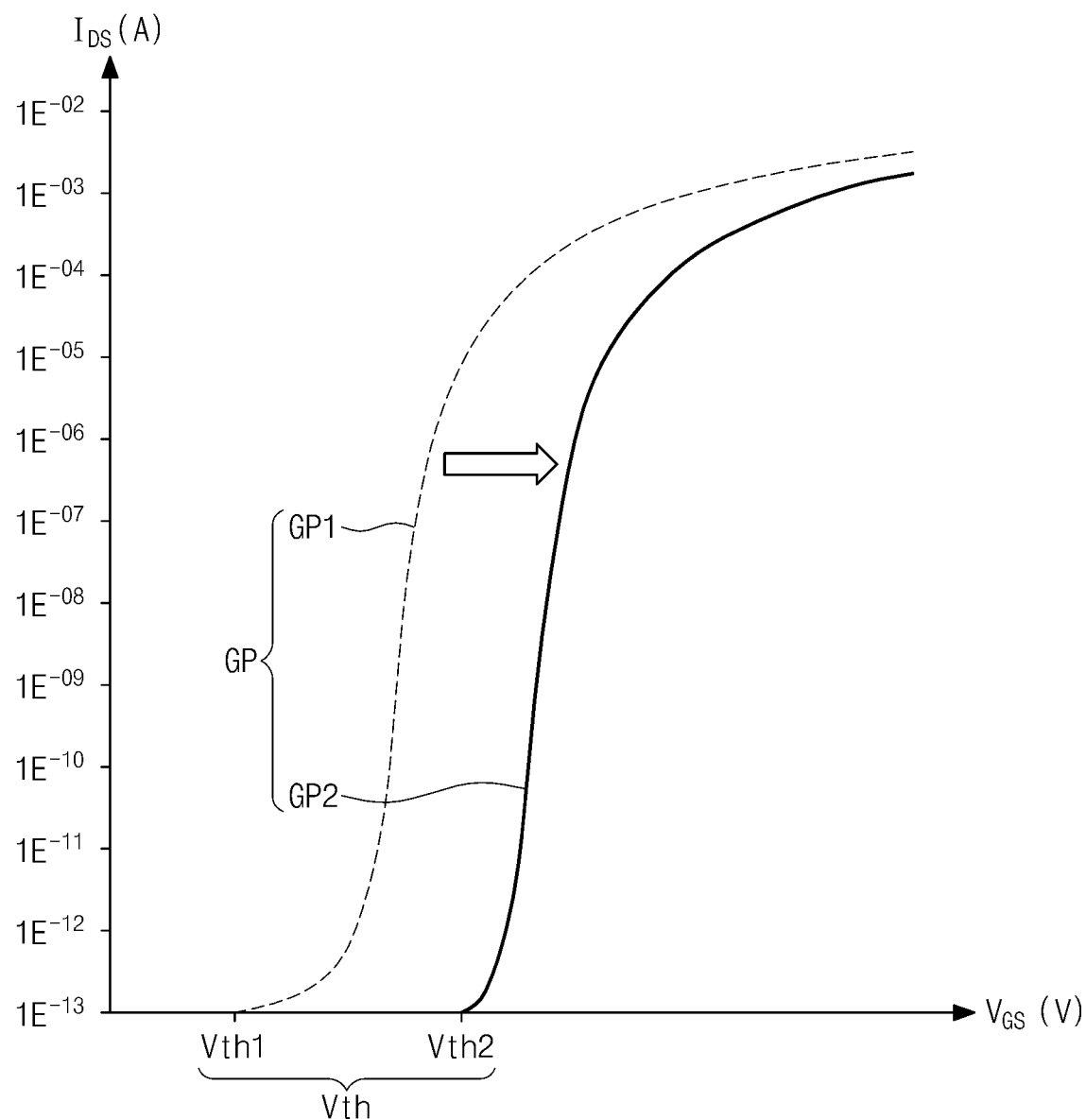
FIGS. 13A-13B are graphs illustrating changes in threshold voltages of driving transistors according to an embodiment of the inventive concept.
Figure 13B:
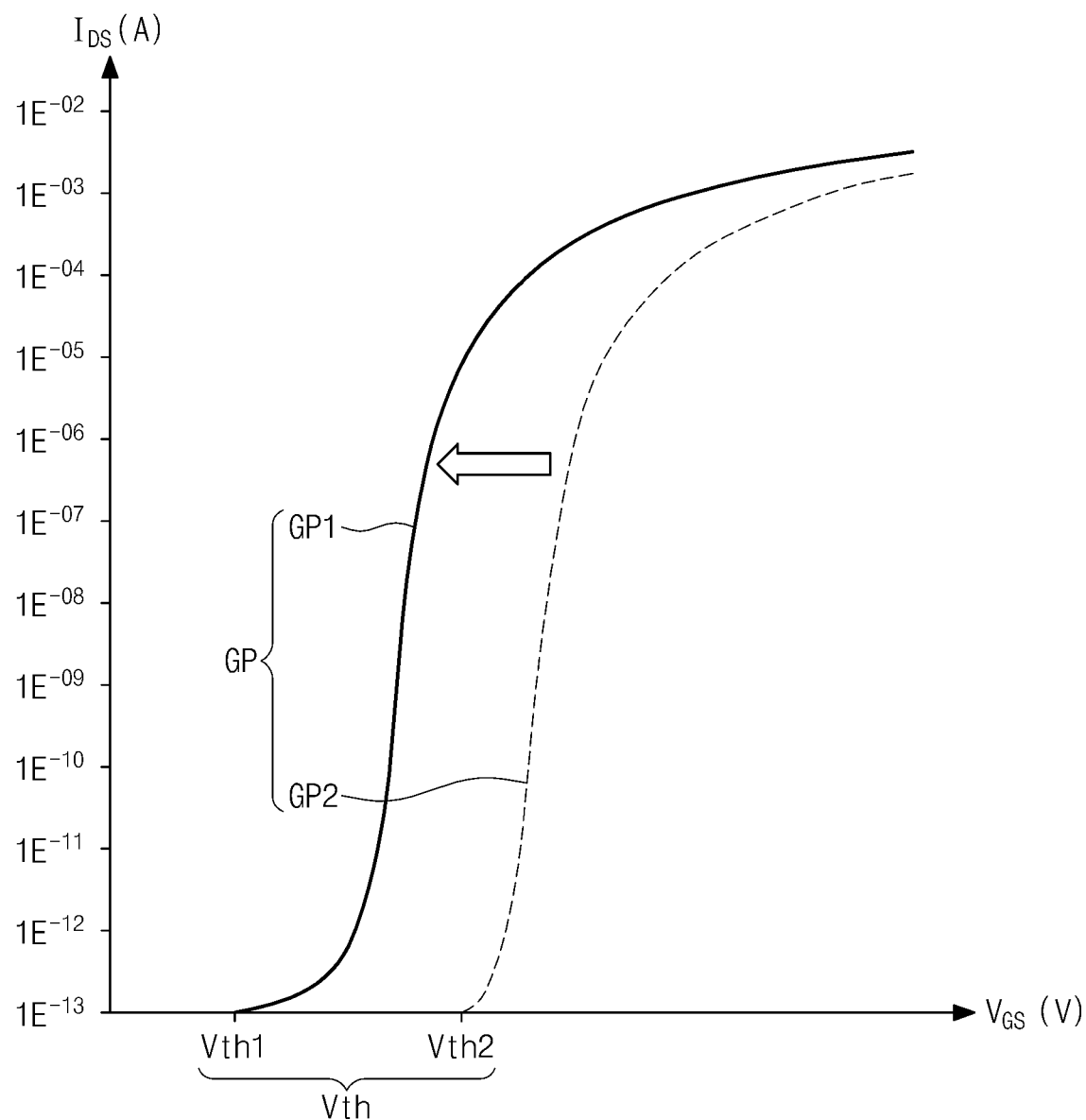

FIGS. 13A and 13B are current graphs GP illustrating changes in threshold voltages Vth of driving transistors TRG according to an embodiment of the inventive concept.

As described above, the first clock voltage VCK1 may be, for example, about 15V to about 35V, and the second clock voltage VCK2 may be, for example, about −15V to about −9V. Since the absolute value of the first clock voltage VCK1 that is a positive voltage is greater than the absolute value of the second clock voltage VCK2 that is a negative voltage, an average voltage of the clock signals CK1, CK2, CK3, and CK4 and the clock bar signals CKB1, CKB2, CKB3, and CKB4 becomes a positive value.

Referring to FIGS. 6 and 13A, the first current graph GP1 illustrates a first threshold voltage Vth1 before the driving transistors TRG become deteriorated. The second current graph GP2 illustrates a second threshold voltage Vth2 after the driving transistors TRG become deteriorated.

The threshold voltages Vth of the driving transistors TRG that receive (e.g., continuously receive) the clock signals CK1, CK2, CK3, and CK4 and/or the clock bar signals CKB1, CKB2, CKB3, and CKB4, of which the average voltage is a positive value, become larger from the first threshold voltage Vth1 to the second threshold voltage Vth2 by deterioration.

If the threshold voltage Vth is increased, because the driving transistors TRG are not turned on/off smoothly, it may be difficult to charge and discharge the corresponding pixel PXij of FIG. 3.

As described with reference to FIGS. 8 to 12, if voltages of the clock signals CK1, CK2, CK3, and CK4, the clock bar signals CKB1, CKB2, CKB3, and CKB4, and/or the second low signal VSS2 during the blank interval BLK are lower than voltages thereof during the frame intervals FR-O and FR-E, then this may compensate for the deterioration of the driving transistors TRG.

Referring to FIG. 13B, by a negative voltage applied during the black interval BLK, the threshold voltages Vth of the driving transistors TRG may be changed (e.g., restored) from the second threshold voltage Vth2 to the first threshold voltage Vth1.

As described above, deterioration may be alleviated when threshold voltages of transistors are increased by a voltage applied to a gate driving circuit.

The electronic or electric devices and/or any other relevant devices or components according to embodiments of the inventive concept described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the inventive concept.

The above-disclosed embodiments are to be considered illustrative and not restrictive, and the appended claims and their equivalents are intended to cover any and all such modifications, enhancements, and other embodiments, which fall within the spirit and scope of the inventive concept. Thus, to the maximum extent allowed by law, the spirit and scope of the inventive concept are to be determined by the broadest permissible interpretation of the following claims and their equivalents, and shall not be restricted or limited by the foregoing detailed description.

What is claimed is:

1. A gate driving circuit comprising a plurality of stages, an i-th stage (i is an integer greater than or equal to 2) from among the plurality of stages being configured:
    to receive a clock signal, a first carry signal, a second carry signal different from the first carry signal, a first low signal, and a second low signal; and
    to output a i-th carry signal to a carry terminal and a i-th gate signal,
    wherein the i-th stage comprises a control circuit comprising a first control transistor configured to control a potential of a Q-node in response to the first carry signal, a second control transistor configured to provide the second low signal to the Q-node in response to the second carry signal, and a third control transistor configured to provide a signal of the carry terminal to the Q-node,
    wherein the third control transistor includes an input electrode directly connected to the carry terminal and an output electrode directly connected to the Q-node.

2. The gate driving circuit of claim 1, wherein the first control transistor includes a control electrode and an input electrode that are commonly connected to an input terminal configured to receive the first carry signal, and an output electrode connected to the Q-node.

3. The gate driving circuit of claim 1, wherein the second control transistor includes an input electrode connected to a voltage input terminal configured to receive the second low signal, a control electrode connected to a control terminal configured to receive the second carry signal, and an output electrode connected to the Q-node.

4. The gate driving circuit of claim 1, wherein a voltage of the second low signal is lower than a voltage of the first low signal.

5. The gate driving circuit of claim 1, wherein the second carry signal is generated based on a clock signal different from the clock signal.

6. A gate driving circuit comprising a plurality of stages, an i-th stage (i is an integer greater than or equal to 2) from among the plurality of stages being configured:
    to receive a clock signal, a first carry signal, a second carry signal different from the first carry signal, a first low signal, and a second low signal; and
    to output a i-th carry signal to a carry terminal and a i-th gate signal,
    wherein the i-th stage comprises a control circuit comprising a first control transistor configured to control a potential of a Q-node in response to the first carry signal, a second control transistor configured to provide the second low signal to the Q-node in response to the second carry signal, and a third control transistor configured to provide a signal of the carry terminal to the Q-node, and
    wherein the third control transistor includes a control electrode connected to a clock terminal, an input electrode connected to the carry terminal, and an output electrode connected to the Q-node.

7. The gate driving circuit of claim 6, wherein the control circuit further comprises a fourth control transistor configured to provide the second low signal to the Q-node in response to a third carry signal different from the first carry signal and the second carry signal.

8. The gate driving circuit of claim 6, wherein the i-th stage further comprises a first output circuit configured to be turned on/off according to a voltage of a Q-node and output the i-th gate signal including a gate-on signal and a gate-off signal from the clock signal to a gate output terminal of the i-th stage.

9. The gate driving circuit of claim 8, wherein the first output circuit comprises a first output transistor, and
    wherein the first output transistor comprises includes an input electrode for receiving the clock signal, a control electrode connected to the Q-node, and an output electrode for outputting the i-th gate signal.

10. The gate driving circuit of claim 9, wherein the control circuit further comprises a capacitor, and
    wherein the capacitor is connected between the output electrode of the first output transistor and the Q-node.

11. The gate driving circuit of claim 8, wherein the i-th stage further comprises a first pull-down circuit configured to provide the first low signal to the gate output terminal after the gate-on signal is outputted from the first output circuit.

12. The gate driving circuit of claim 11, wherein the first pull-down circuit comprises a first pull-down transistor, and
    wherein the first pull-down transistor includes an input electrode connected to a voltage input terminal configured to receive the first low signal, a control electrode connected to a clock bar terminal, and an output electrode connected to the first output circuit.

13. The gate driving circuit of claim 8, wherein the i-th stage further comprises a second output circuit configured to be turned on/off according to the potential of the Q-node and output the i-th carry signal including a carry-on signal and a carry-off signal from the clock signal to the carry terminal of the i-th stage.

14. The gate driving circuit of claim 13, wherein the second output circuit comprises a second output transistor, and wherein the second output transistor includes an input electrode for receiving the clock signal, a control electrode connected to the Q-node, and an output electrode for outputting the i-th carry signal.

15. The gate driving circuit of claim 13, wherein the i-th stage further comprises a second pull-down circuit configured to provide the second low signal to the carry terminal after the carry-on signal is outputted from the second output circuit, and wherein the input electrode of the third control transistor is connected to the second pull-down circuit.

16. The gate driving circuit of claim 15, wherein the second pull-down circuit comprises a second pull-down transistor, and wherein the second pull-down transistor includes an input electrode connected to a voltage input terminal configured to receive the second low signal, a control electrode connected to a clock bar terminal, and an output electrode connected to the second output circuit.

* * * * *